US011450739B2

United States Patent
Glass et al.

(10) Patent No.: US 11,450,739 B2
(45) Date of Patent: Sep. 20, 2022

(54) GERMANIUM-RICH NANOWIRE TRANSISTOR WITH RELAXED BUFFER LAYER

(71) Applicant: INTEL CORPORATION, Santa Clara, CA (US)

(72) Inventors: Glenn Glass, Portland, OR (US); Anand Murthy, Portland, OR (US); Cory Bomberger, Portland, OR (US); Tahir Ghani, Portland, OR (US); Jack Kavalieros, Portland, OR (US); Siddharth Chouksey, Portland, OR (US); Seung Hoon Sung, Portland, OR (US); Biswajeet Guha, Hillsboro, OR (US); Ashish Agrawal, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 860 days.

(21) Appl. No.: 16/131,520

(22) Filed: Sep. 14, 2018

(65) Prior Publication Data

US 2020/0091287 A1 Mar. 19, 2020

(51) Int. Cl.
*H01L 29/06* (2006.01)
*H01L 21/82* (2006.01)
(Continued)

(52) U.S. Cl.
CPC .. *H01L 29/0673* (2013.01); *H01L 21/823821* (2013.01); *H01L 29/0649* (2013.01);
(Continued)

(58) Field of Classification Search
CPC ... H01L 29/06; H01L 29/067; H01L 29/0673; H01L 21/82; H01L 21/823; H01L 21/8238; H01L 21/82382; H01L 21/823821
(Continued)

(56) References Cited

U.S. PATENT DOCUMENTS 9,502,420 B1 11/2016 Bedell et al.
9,608,055 B2 * 3/2017 Rachmady .......... H01L 29/7781
(Continued)

FOREIGN PATENT DOCUMENTS

WO 2019005112 A1 1/2019

OTHER PUBLICATIONS

Exended European Search Report received for EP Application No. 19183091.8, dated Dec. 16, 2019. 9 pages.
(Continued)

*Primary Examiner* — Monica D Harrison
(74) *Attorney, Agent, or Firm* — Schwabe, Williamson & Wyatt, P.C.

(57) ABSTRACT

A semiconductor structure has a substrate including silicon and a layer of relaxed buffer material on the substrate with a thickness no greater than 300 nm. The buffer material comprises silicon and germanium with a germanium concentration from 20 to 45 atomic percent. A source and a drain are on top of the buffer material. A body extends between the source and drain, where the body is monocrystalline semiconductor material comprising silicon and germanium with a germanium concentration of at least 30 atomic percent. A gate structure is wrapped around the body.

20 Claims, 8 Drawing Sheets

(51) Int. Cl.
- *H01L 21/8238* (2006.01)
- *H01L 29/08* (2006.01)
- *H01L 29/161* (2006.01)
- *H01L 29/423* (2006.01)
- *H01L 29/66* (2006.01)
- *H01L 29/78* (2006.01)

(52) U.S. Cl.
CPC ........ *H01L 29/0847* (2013.01); *H01L 29/161* (2013.01); *H01L 29/42356* (2013.01); *H01L 29/66545* (2013.01); *H01L 29/7851* (2013.01); *H01L 2029/7858* (2013.01)

(58) Field of Classification Search
USPC ........................................................ 257/401
See application file for complete search history.

(56) References Cited

U.S. PATENT DOCUMENTS

| | | | |
|---|---|---|---|
| 11,171,207 B2 * | 11/2021 | Rachmady | .......... H01L 29/1037 |
| 2006/0019466 A1 | 1/2006 | Nayfeh et al. | |
| 2013/0334606 A1 | 12/2013 | Shen et al. | |
| 2014/0027816 A1 | 1/2014 | Cea et al. | |
| 2016/0104799 A1 | 4/2016 | Qi et al. | |
| 2016/0293601 A1 | 10/2016 | Majhi et al. | |
| 2016/0336450 A1 * | 11/2016 | Tak | .................. H01L 29/66545 |
| 2018/0047832 A1 | 2/2018 | Tapily et al. | |
| 2018/0151452 A1 | 5/2018 | Doornbos et al. | |

OTHER PUBLICATIONS

International Preliminary Report on Patentability received for PCT Application No. PCT/US2017/040320, dated Jan. 9, 2020. 12 pages.

Lin, Hai, "Growth and Characterization Of GeSn and SiGeSn Alloys for Optical Interconnects," Submitted to The Department of Materials Science and Engineering and The Committee on Graduate Studies of Stanford University, May 2012. 139 pages.

"Realization of Silicon-Germanium-Tin (SiGeSn) Source/Drain Stressors by Sn implant and Solid Phase Epitaxy for strain engineering in SiGe channel P-MOSFET," IEEE Xplore: May 23, 2008. 2 pages.

Fan, et al., "SiGeC/Si superlattice microcoolers," Applied Physics Letters, vol. 78, issue 11. Published Online: Mar. 8, 2001. 8 pages.

Yamanaka, et al., "Strain Relaxation and Induced Defects in SiGe Thin Films Grown on Ion-Implanted Si Substrates," Materials Transactions, vol. 45., No. 8. 2004, The Japan Institute of Metals. pp. 2644-2646.

International Search Report and Written Opinion received for PCT Application No. PCT/US2017/040320 dated Feb. 23, 2018. 15 pages.

Office Action for European Patent Application No. 19183091.8, dated Dec. 2, 2021 7 pages.

* cited by examiner

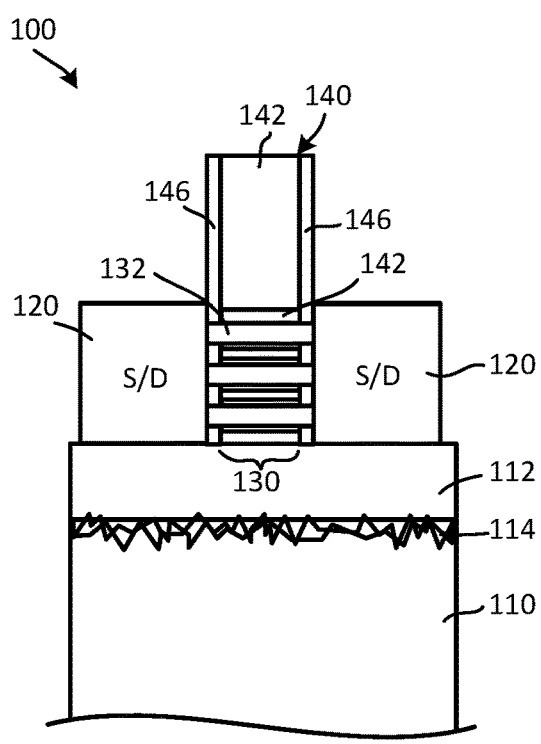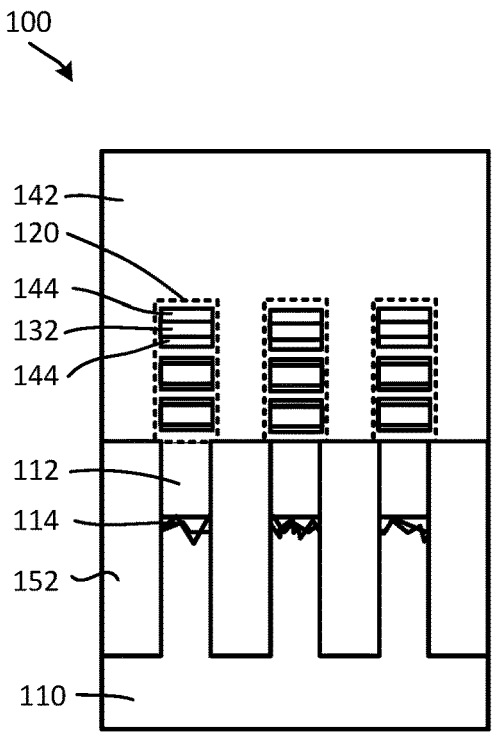
FIG. 1A　　　　　　　　FIG. 1B
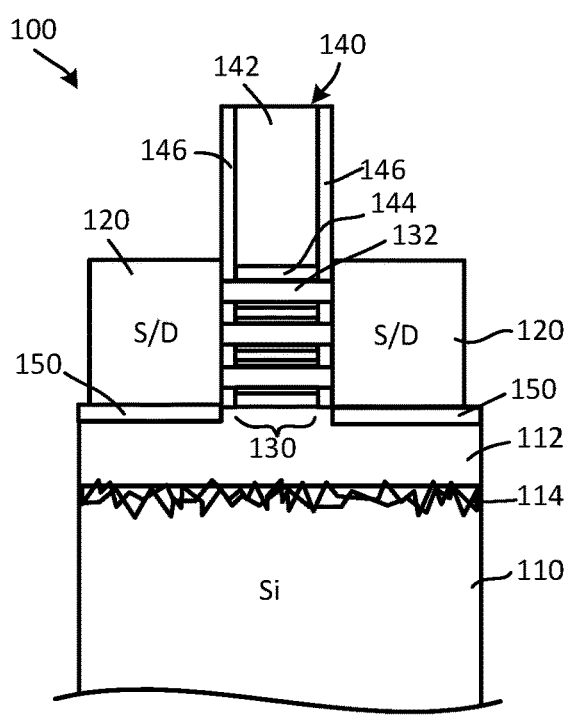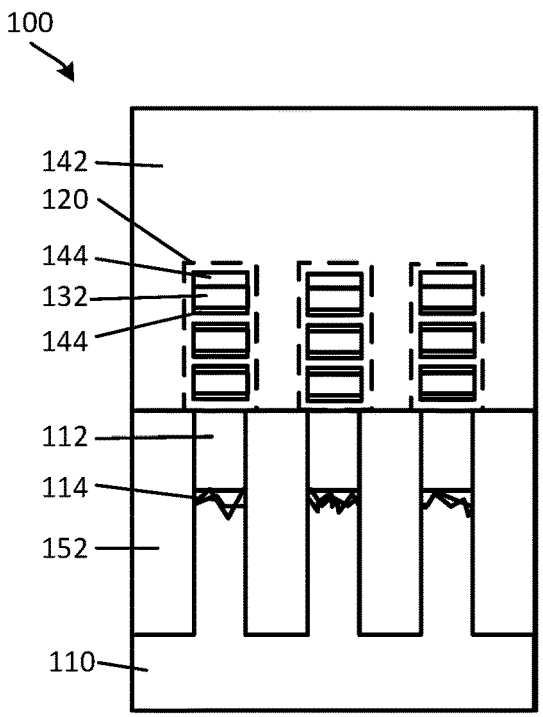
FIG. 2A　　　　　　　　FIG. 2B

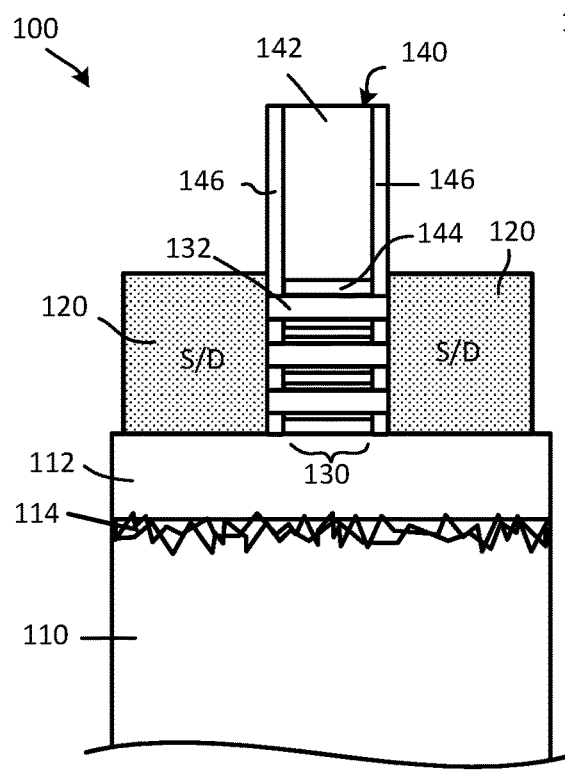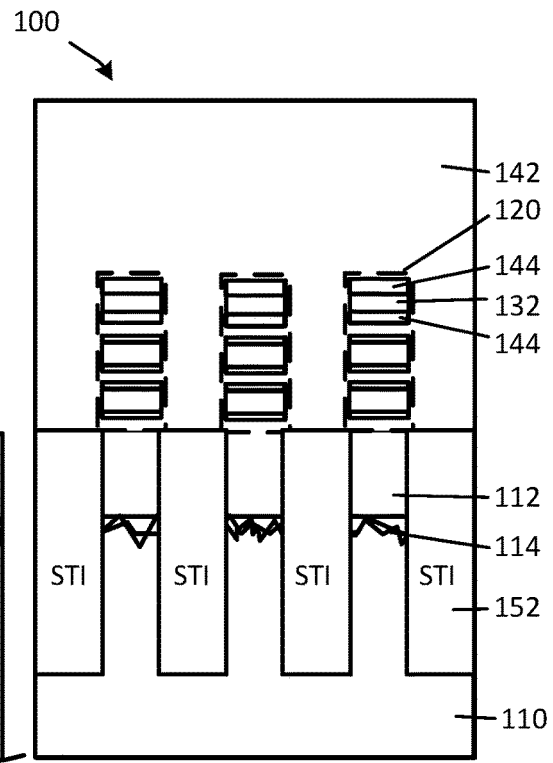
FIG. 3A  FIG. 3B
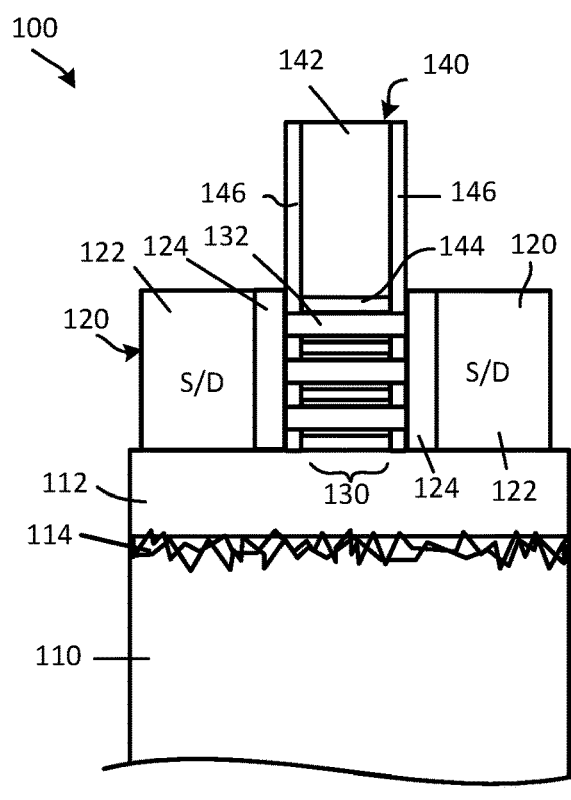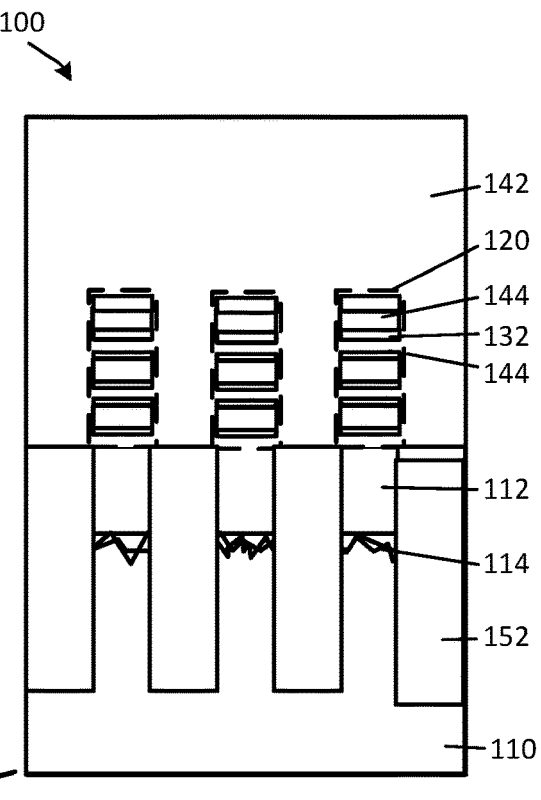
FIG. 4A  FIG. 4B

GERMANIUM-RICH NANOWIRE TRANSISTOR WITH RELAXED BUFFER LAYER

BACKGROUND

Semiconductor devices are electronic components that exploit the electronic properties of semiconductor materials, such as silicon (Si), germanium (Ge), gallium arsenide (GaAs), and indium phosphide (InP). A field-effect transistor (FET) is a semiconductor device that includes three terminals: a gate, a source, and a drain. A FET uses an electric field applied by the gate to control the electrical conductivity of a channel through which charge carriers (e.g., electrons or holes) flow between the source and drain. In instances where the charge carriers are electrons, the FET is referred to as an n-channel device, and in instances where the charge carriers are holes, the FET is referred to as a p-channel device. Some FETs have a fourth terminal called the body or substrate, which can be used to bias the transistor. In addition, metal-oxide-semiconductor FETs (MOSFETs) include a gate dielectric between the gate and the channel. MOSFETs may also be known as metal-insulator-semiconductor FETs (MISFETSs) or insulated-gate FETs (IGFETs). Complementary MOS (CMOS) structures use a combination of p-channel MOSFET (PMOS) and n-channel MOSFET (NMOS) devices to implement logic gates and other digital circuits.

A FinFET is a MOSFET transistor built around a thin strip of semiconductor material (generally referred to as a fin). The conductive channel of the FinFET device resides on the outer portions of the fin adjacent to the gate dielectric. Specifically, current runs along/within both sidewalls of the fin (sides perpendicular to the substrate surface) as well as along the top of the fin (side parallel to the substrate surface). Because the conductive channel of such configurations includes three different planer regions of the fin (e.g., top and two sides), such a FinFET design is sometimes referred to as a tri-gate transistor. A nanowire transistor (sometimes referred to as a gate-all-around (GAA) or nanoribbon transistor) is configured similarly to a fin-based transistor, but instead of a finned channel region with the gate in contact with three sides of the fin, one or more nanowires extend between the source and the drain regions. In nanowire transistors the gate material generally surrounds or encircles each nanowire (hence, gate-all-around).

BRIEF DESCRIPTION OF THE DRAWINGS

FIG. 1A illustrates a cross-sectional view taken through a channel of a nanowire transistor structure with a relaxed buffer material on the substrate below the source and drain and defects propagating into the substrate from the interface with the relaxed buffer material, in accordance with an embodiment of the present disclosure.

FIG. 1B illustrates a cross-sectional view taken through a gate electrode of the nanowire transistor structure of FIG. 1A and shows shallow trench isolation material in trenches extending into the substrate between adjacent devices, in accordance with an embodiment of the present disclosure.

FIG. 2A illustrates a cross-sectional view taken through a channel of a nanowire transistor structure with a layer of isolation material between the source/drain and the relaxed buffer material, in accordance with an embodiment of the present disclosure.

FIG. 2B illustrates a cross-sectional view taken through a gate electrode of the nanowire transistor structure of FIG. 2A, in accordance with an embodiment of the present disclosure.

FIG. 3A illustrates a cross-sectional view taken through a channel of a nanowire transistor structure, in accordance with another embodiment of the present disclosure.

FIG. 3B illustrates a cross-sectional view taken through a gate electrode of the nanowire transistor structure of FIG. 3A, in accordance with an embodiment of the present disclosure.

FIG. 4A illustrates a cross-sectional view taken through a channel of a nanowire transistor structure and shows source/drain regions that include an end portion with a different composition adjacent the gate structure, in accordance with another embodiment of the present disclosure.

FIG. 4B illustrates a cross-sectional view taken through a gate electrode of the nanowire transistor structure of FIG. 4A, in accordance with an embodiment of the present disclosure.

Figure 5:
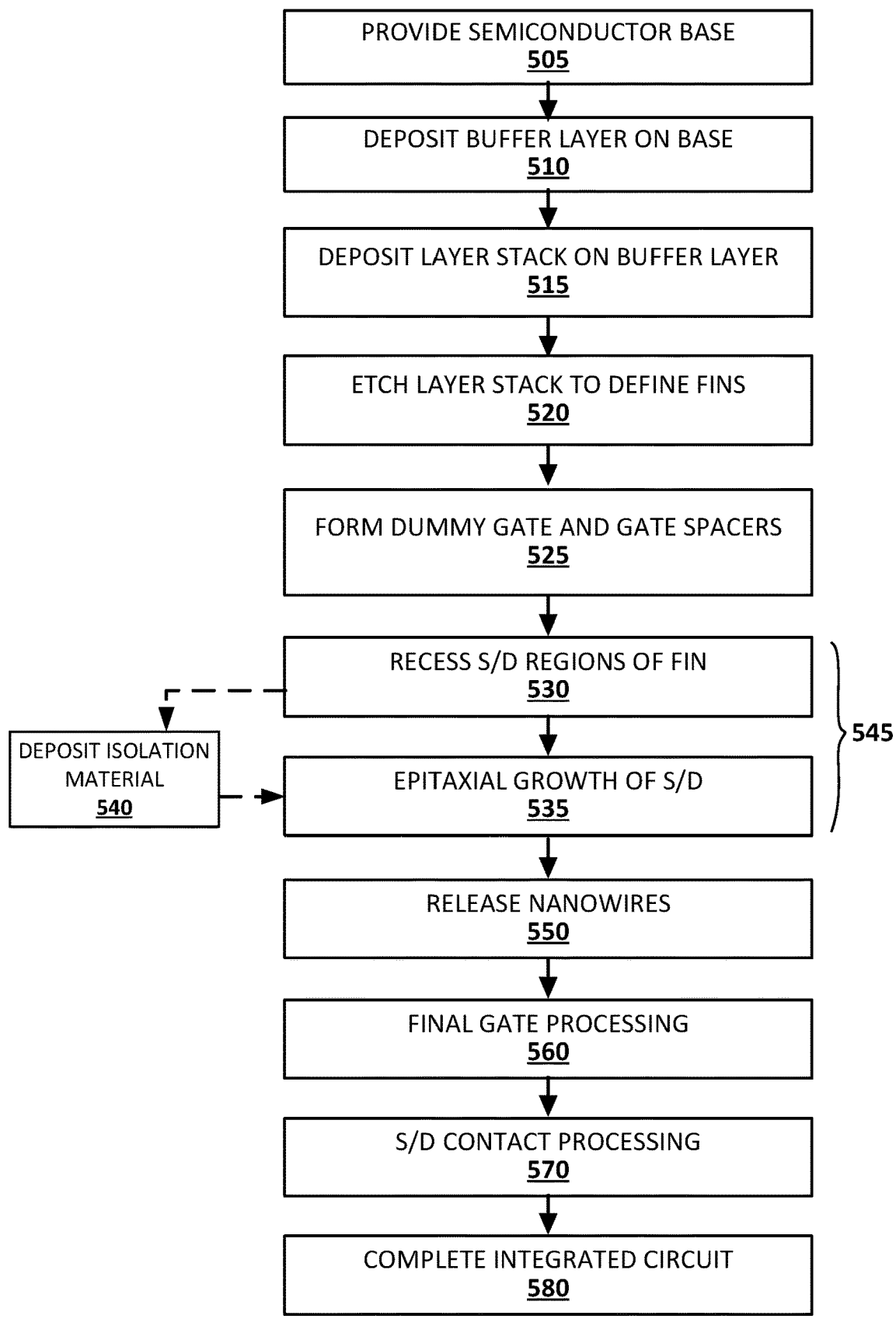
FIG. 5 illustrates processes in a method of forming an integrated circuit that includes one or more nanowire or nanoribbon transistor, in accordance with an embodiment of the present disclosure.

These and other features of the present embodiments will be understood better by reading the following detailed description, taken together with the figures herein described. In the drawings, each identical or nearly identical component that is illustrated in various figures may be represented by a like numeral. For purposes of clarity, not every component may be labeled in every drawing. Furthermore, as will be appreciated, the figures are not necessarily drawn to scale or intended to limit the described embodiments to the specific configurations shown. For instance, while some figures generally indicate straight lines, right angles, and smooth surfaces, an actual implementation of the disclosed techniques may have less than perfect straight lines and right angles, and some features may have surface topography or otherwise be non-smooth, given real-world limitations of fabrication processes. Further still, some of the features in the drawings may include a patterned and/or shaded fill, which is merely provided to assist in visually identifying the different features. In short, the figures are provided merely to show example structures.

DETAILED DESCRIPTION

Techniques are disclosed for forming a germanium-rich (Ge-rich) nanowire or nanoribbon transistor. In one embodiment, a semiconductor structure includes a base layer or substrate comprising silicon. A relatively thin layer of relaxed buffer material is on the substrate. In some embodiments, the relaxed buffer material has a thickness no greater than 200 to 300 nm. The relaxed buffer material comprises silicon and germanium with a germanium concentration from 20 to 45 atomic percent. In some embodiments, the relaxed buffer layer material relaxes from 70 to 100% relative to the substrate. In some embodiments, the relaxation is at last 75%. The relaxed buffer material functions as a virtual substrate for subsequently formed materials in the device. The transistor structure includes a source and a drain. A body of monocrystalline silicon germanium (SiGe) extends between the source and drain and has a germanium concentration of at least 30 atomic percent. For example, the body is a nanowire, nanoribbon, or nanosheet of monocrystalline SiGe. In some embodiments, the body has a germanium concentration from 30 to 85 atomic percent. A gate structure is wrapped around the body and includes a gate dielectric and a gate electrode, where the gate dielectric is between the body and the gate electrode.

The nanowires/nanoribbons/nanosheets are strained to the relaxed buffer material as analyzed by transmission electron spectroscopy (TEM). Due to relaxation of the buffer material, defects can be observed at the interface between the silicon substrate and the SiGe buffer material, where the defects originate at the interface between the substrate and the relaxed buffer material and terminate in the silicon substrate below. As such, the relaxed buffer material is nominally free of defects and serves as a template for strained SiGe.

In some embodiments, the transistor structure includes a layer of isolation material below the source and/or drain (S/D), such as between the relaxed buffer material and the S/D material. The isolation material is useful to prevent or reduce leakage between the source and drain via the relaxed buffer or the substrate material (e.g., Silicon).

In some embodiments, the substrate may exhibit implant damage in the lattice due to implantation. The substrate and/or relaxed buffer material comprise carbon, arsenic, hydrogen, helium, or nitrogen in some embodiments.

In some embodiments having a high germanium concentration in the channel region, the source and drain are processed to include an end portion adjacent the channel that reduces or prevents diffusion of phosphorous used as a dopant. The end portion can be epitaxial material that is rich in germanium (e.g., up to 100% germanium), SiGe that includes up to 4% carbon (SiGeC), or germanium compounds that include tin (e.g., SiGeSn and GeSn alloys).

Methodologies and structures of the present disclosure are useful for a CMOS transistor device. For example, the NMOS transistor has a silicon channel the PMOS transistor has a SiGe channel with germanium greater than 30%. The transistor devices can be nanowire or TFET devices, for example.

Although the present disclosure discusses improvements in SiGe transistor devices, other Group III-V materials may benefit from the methodologies of the present disclosure. The methodologies may be applied to any compressively-strained material, including indium gallium arsenide (InGaAs), antimonides, or any heteroepitaxial material that is difficult to grow on a silicon substrate, for example. Using a relaxed buffer material with 20-45% Ge accomplishes the goal of maintaining strain in the nanowire below a critical value where the wire would relax plastically. Such material has a germanium concentration that bridges the gap in lattice constants between the substrate and the channel material, but does not completely eliminate strain, in accordance with some embodiments. Using methodologies of the present disclosure, misfit dislocations are present below the interface between the relaxed buffer material and the silicon substrate. The relaxed buffer material above is nominally free of defects and has a relaxed lattice constant. Numerous variations and embodiments will be apparent in light of the present disclosure.

General Overview

Field effect transistors (FETs) have been scaled to smaller and smaller sizes to achieve faster circuit operation. Such scaling has resulted in the development of the nanowire and nanoribbon transistors or gate-all-around (GAA) transistors. For example, the GAA channel region can have one or more nanowires extending between the source and drain regions, such as a vertical stack of nanowires that extend horizontally between the source and drain regions. The gate structure wraps around the nanowire(s). In one example methodology, alternating layers of silicon (Si) and silicon germanium (SiGe) are formed epitaxially on a bulk silicon substrate. Etching down into the layer stack defines one or more fins that include a silicon subfin and alternating layers of SiGe and Si on top of the subfin. The SiGe can be removed to release silicon nanowires extending between and connecting the source and drain regions of the fin. Similarly, the silicon can be removed to release SiGe nanowires extending between and connecting the source and drain regions. In some embodiments, a CMOS transistor structure can be formed with silicon nanowires in n-MOS devices and SiGe channel in p-MOS devices. In other embodiments, both n-MOS and p-MOS devices have silicon wire channels. In yet other embodiments, both n-MOS and p-MOS devices have SiGe wire channels.

SiGe structures formed on Si may exhibit misfit dislocations and other faults due to lattice mismatch between the materials. When SiGe has an atomic germanium content greater than 30% and thickness greater than a few hundred angstroms, for example, the lattice may relax to form misfit dislocations that are detrimental to device performance. Fabricating high quality SiGe nanowire devices with a germanium concentration of 40% or more typically requires nominally defect-free channel regions. Relaxation structures can be used to avoid or reduce dislocations, such as a layer of SiGe with the Ge concentration graded over a thickness of 2 to 10 µm. However, relaxation structures with a thickness greater than 1 µm are not amenable to high-volume manufacturing due to high costs of material and energy, low throughput, and short chamber life, among other challenges. Wafer bonding and other techniques are available, but also are not amendable to high-volume manufacturing. Another challenge is current leakage through the substrate between the source and drain. Further challenges include dopant diffusion and unintentional damage to SiGe S/D regions when removing the silicon between SiGe nanowires.

Accordingly, a need exists for improved methodologies for forming a SiGe device structures with a germanium concentration greater than 30 atomic percent. Thus, and in accordance with various embodiments of the present disclosure, techniques are provided for forming a SiGe channel structure that employs a thin relaxation layer (e.g., <300 nm). In one such embodiment, a layer stack of Si and SiGe is formed on the relaxation layer, followed by processing the layer stack into fins, and then into nanowire transistors. In some embodiments, the layer stack is nominally free of defects and the materials in the layer stack have relaxed lattice constants. The relaxation layer serves as a relaxed buffer layer for a compressively-strained SiGe channel PMOS transistor and tensile-strained Si channel NMOS transistor simultaneously. For example, the relaxed buffer layer is SiGe with germanium concentration from 20 to 45 at % that is at least 75% relaxed. On top of the relaxed buffer layer, a layer stack of Si and SiGe is formed, followed by processing to define nanowire, nanoribbons, or nanosheets that are defect-free and have relaxed lattice constants. Using such methodologies, a device having a channel with multiple nanowires or nanoribbons can be fabricated, where the channel material is SiGe with up to 85 at % Ge.

In some embodiments, a sacrificial layer is added onto the top of the relaxed buffer layer, followed by depositing the layer stack of Si and SiGe. After forming the transistor structure, the sacrificial layer can be removed and replaced with isolation material. The resulting structure includes an isolation layer below the source and drain.

Conventionally, epitaxial source and drain regions having up to 100% Ge provide little strain benefit in p-MOS devices. To improve on this, one embodiment according to the present disclosure utilizes SiGe source and drain regions having low Ge content for n-MOS devices. For p-MOS devices, tin can be added to the SiGe to provide strain equivalent to a SiGe material having ~50 at % Ge. The resulting structure includes an epitaxial S/D structure.

In a further embodiment, epitaxial n-type S/D regions can prevent or reduce phosphorous diffusion by using a carbon-rich layer in the end portion of the S/D adjacent the channel region. In yet a further embodiment for both p-type and n-type S/D, SiGe etchout in the S/D can be minimized by using Ge-rich regions at the tip of the S/D adjacent the channel region, so that when Si is etched out of the layer stack in the channel region, the epitaxial SiGe in the S/D does not get unintentionally damaged. In some embodiments, the S/D includes an end portion with up to 4% carbon and/or a high germanium content. In some embodiments, the end portion includes tin, such as an alloy of SiGeSn or GeSn.

The presence of interface processing can be identified by the presence of defects (dislocations stacking and faults) that begin at the Si substrate-SiGe buffer interface but terminate in the substrate material below the relaxed buffer region. Such defects can be detected using through TEM imaging. The relaxed buffer layer can include one or more of Si, Ge, C, Ar, H, He, or N. The elements in the relaxed buffer layer can be identified via SIMS, TEM EDX mapping, or Atom Probe Tomography. Signatures of long range implant damage below the Si substrate—SiGe buffer interface can be detected TEM imaging. Such signatures may include lattice damage that is indicative of an ion implantation process to form the relaxed buffer layer.

The relaxed buffer layer thus fabricated could serve as the template for Si or SiGe channel CMOS transistors either via film deposition plus fin patterning, or through the aspect-ratio-trapping (ART) approach within trenches. The relaxed buffer could also serve as the template for fabricating nanowire or TFET transistors. The process flow can be gate first or gate last. The source/drain (S/D) can be formed either via etch plus fill or through a raised S/D approach.

As used herein, the term "nanowire" is not limited to structures of a particular cross-sectional shape, but includes structures of a rectangular, square, trapezoidal, "racetrack" (e.g., parallel sides connected by rounded ends), circular, oval, elongated, and other cross-sectional shapes, some of which may be referred to as nanoribbons or nanosheets. Specifically, in accordance with some embodiments, a nanowire is a structure that has a thickness or diameter on the order of tens of nanometers or less, and an unconstrained length.

The use of "group IV semiconductor material" (or "group IV material" or generally, "IV") herein includes at least one group IV element (e.g., silicon, germanium, carbon, tin), such as silicon (Si), germanium (Ge), silicon-germanium (SiGe), and so forth. The use of "group III-V semiconductor material" (or "group III-V material" or generally, "III-V") herein includes at least one group III element (e.g., aluminum, gallium, indium) and at least one group V element (e.g., nitrogen, phosphorus, arsenic, antimony, bismuth), such as gallium arsenide (GaAs), indium gallium arsenide (InGaAs), indium aluminum arsenide (InAlAs), gallium phosphide (GaP), gallium antimonide (GaSb), indium phosphide (InP), gallium nitride (GaN), and so forth. Note that group III may also be known as the boron group or IUPAC group 13, group IV may also be known as the carbon group or IUPAC group 14, and group V may also be known as the nitrogen family or IUPAC group 15, for example.

Materials that are "compositionally different" or "compositionally distinct" as used herein refers to two materials that have different chemical compositions. This compositional difference may be, for instance, by virtue of an element that is in one material but not the other (e.g., SiGe is compositionally different from silicon), or by way of one material having all the same elements as a second material but at least one of those elements is intentionally provided at a different concentration in one material relative to the other material (e.g., SiGe having 70 atomic percent germanium is compositionally different from SiGe having 25 atomic percent germanium). In addition to such chemical composition diversity, the materials may also have distinct dopants (e.g., gallium and magnesium) or the same dopants but at differing concentrations. In still other embodiments, compositionally distinct materials may further refer to two materials that have different crystallographic orientations. For instance, (110) silicon is compositionally distinct or different from (100) silicon.

Note that the use of "source/drain" herein is simply intended to refer to a source region or a drain region or both a source region and a drain region. Source/drain is abbreviated S/D. To this end, the forward slash ("/") as used herein means "and/or" unless otherwise specified and is not intended to implicate any particular structural limitation or arrangement with respect to source and drain regions, or any other materials or features that are listed herein in conjunction with a forward slash.

In some embodiments, the techniques described herein can be used to benefit n-channel devices (e.g., NMOS) and/or p-channel devices (e.g., PMOS). In some embodiments, the techniques described herein can be used to form complementary transistor circuits (such as CMOS circuits), where the techniques can be used to benefit one or more of the included n-channel and p-channel transistors making up the CMOS circuit. For instance, SiGe may be used in the channel of one or more PMOS devices and Si may be used in the channel of one or more NMOS devices.

Further, in some embodiments, the techniques described herein can be used to benefit MOSFET devices, FinFET devices, and/or any other suitable devices as will be apparent in light of this disclosure. Further yet, in some embodiments, the techniques described herein can be used to benefit a multitude of transistor configurations, such as planar and non-planar configurations, where the non-planar configurations may include finned or FinFET configurations (e.g., dual-gate or tri-gate), gate-all-around (GAA) configurations (e.g., nanowire or nanoribbon), or some combination thereof (e.g., beaded-fin configurations), to provide a few examples. In addition, in some embodiments, the techniques can be used for a variety of source/drain (S/D) configurations, such as replacement material S/D, cladded S/D, and/or any other suitable S/D configuration as will be apparent in light of this disclosure. The techniques described herein may be used to benefit logic transistor devices or transistor-based devices used for other suitable applications (e.g., amplification, switching, etc.). Therefore, the techniques described herein can be used to benefit a multitude of transistor devices.

In general, the techniques allow transistors to be further scaled with diverse channel materials, while ensuring higher operating voltage, higher drive currents, and thereby improved performance. Further still, any such devices may employ semiconductor materials that are three-dimensional crystals as well as two dimensional crystals or nanotubes, for example. In some embodiments, the techniques may be used to benefit devices of varying scales, such as IC devices having critical dimensions in the micrometer (micron) range and/or in the nanometer (nm) range (e.g., formed at the 22, 14, 10, 7, 5, or 3 nm process nodes, or beyond).

Use of the techniques and structures provided herein may be detectable using tools such as electron microscopy including scanning/transmission electron microscopy (SEM/TEM), scanning transmission electron microscopy (STEM), nano-beam electron diffraction (NBD or NBED), and reflection electron microscopy (REM); composition mapping; x-ray crystallography or diffraction (XRD); energy-dispersive x-ray spectroscopy (EDX); secondary ion mass spectrometry (SIMS); time-of-flight SIMS (ToF-SIMS); atom probe imaging or tomography; local electrode atom probe (LEAP) techniques; 3D tomography; or high resolution physical or chemical analysis, to name a few suitable example analytical tools. For example, in some embodiments, such tools may indicate a transistor with a nanowire channel region of SiGe having a germanium concentration of 40 at % or more. Further, such tools can be used to detect, a Ge-rich SiGe channel material that is free of defects and has a relaxed lattice constant. For example, TEM can be useful to show a cross section of the device structure. In another example, x-ray crystallography can be useful to illustrate the crystal quality of the active channel material. X-ray crystallography may be used to illustrate the presence of germanium in the end portions of a nanowire, but a body portion that is free of germanium. In some embodiments, the techniques described herein may be detected based on the benefits derived from their use, which includes channel materials with improved shapes, reduced impurities, improved carrier mobility, relatively higher operating voltage, relatively higher drive currents, and/or other improved device performance. Numerous configurations and variations will be apparent in light of this disclosure.

Architecture and Methodology

Figure 12:
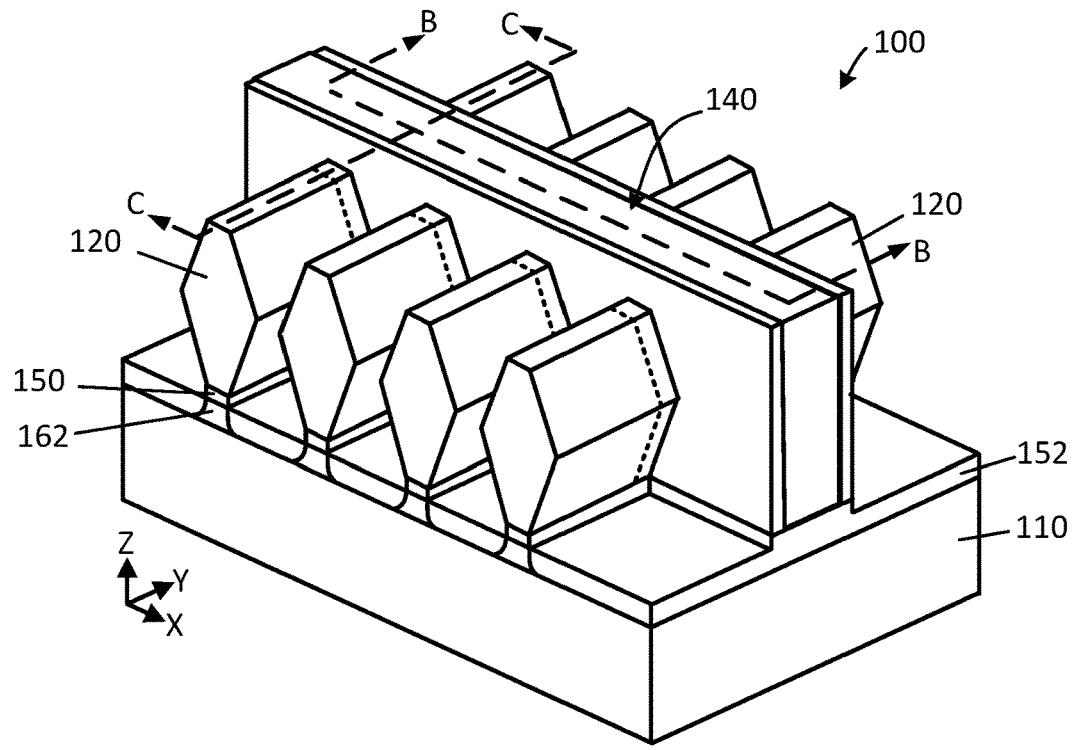
FIG. 12 illustrates a perspective view of a semiconductor structure showing the transistor structure after final gate processing, in accordance with an embodiment of the present disclosure.

FIGS. 1A and 1B illustrate cross-sectional views of a nanowire transistor structure 100 in accordance with an embodiment of the present disclosure, where FIG. 1A is a section taken through the channel region 130 of one device, such as along line C-C of FIG. 12. FIG. 1B is a section taken through the gate structure 140 and perpendicular to the channel regions 130 of three devices, such as along line B-B of FIG. 12. In these example embodiments, the transistor structure 100 includes a base layer or substrate 110, such as single-crystal silicon or other suitable semiconductor material. A relatively thin and layer of relaxed buffer material 112 is on the substrate 110. For example, the relaxed buffer material 112 is $Si_{1-x}Ge_x$ with x from 0.2 to 0.45, where the SiGe is at least 75% relaxed relative to the substrate 110. In some embodiments, the buffer material 112 has a thickness not greater than 300 nm, including 200 nm or less. Source and drain regions 120 are formed on the relaxed buffer material 112 and in contact with opposite sides of a channel region 130. In one embodiment, such as when the channel region 130 has one or more nanowires 132, the channel region 130 is formed initially on the relaxed buffer material 112 as a layer stack of alternating materials. For example, the channel region 130 has a layer stack with alternating layers of nominally defect-free Si and SiGe. In some embodiments, the Si exhibits tensile strain and the SiGe exhibits compressive strain in the layer stack, but the remaining material in the channel region 130 has a relaxed lattice constant after releasing the nanowires. For example, the SiGe relaxes from 70% to 100% relative to the Si after releasing the nanowires. The SiGe has from 30 to 85 at % germanium. In other embodiments, the channel region 130 is a germanium-rich fin of SiGe.

Defects 114 originate at the interface between the relaxed buffer material 112 and the substrate 110 and propagate into the substrate 110. The defects 114 can include dislocations and stacking faults, for example. However, the middle and upper portions of the relaxed buffer material 112 are nominally free of defects and defects 114 are not commonly present at the interface between the relaxed buffer material and source and drain regions 120 or at the interface between the buffer material 112 and the channel region 130. Accordingly, nominally defect-free, Ge-rich SiGe can be formed on the relaxed buffer material 112. Defects 114 can be detected using transmission electron microscopy (TEM). As used herein, "defect free" means having fewer than 1E5 defects per $cm^2$, which commonly corresponds to the limit of detection for TEM technology.

A gate structure 140 is formed over and in contact with the channel region 130, which may be a fin or include nanowires, for example. The gate structure 140 includes a gate electrode 142, a gate dielectric 144, and gate spacers 146, for example. The gate spacers 146 contact opposite faces of the gate electrode 142 and electrically isolate the source and drain regions 120 from the gate electrode 142. In one embodiment, the channel region 130 includes nanowires 132 extending between and connecting the source and drain regions 120. In some such embodiments, the nanowires 140 comprise SiGe with a germanium content from 40% to 85%. The gate dielectric 144 and gate electrode 142 wrap around the body of each nanowire 132 between the gate spacers 146. The gate spacers 146 align with and contact ends of each nanowire 132.

As shown in FIG. 1B, a layer of shallow trench isolation (STI) material 152 fills trenches between subfins of the substrate 110 and relaxed buffer material 112 as a result of nanowire processing, which is discussed in more detail below. The gate dielectric 144 can be seen above and below each nanowire 132 in this cross-sectional view. The gate electrode 142 fills the area between the gate dielectric 134 on adjacent nanowires 132. An outline of the S/D region 120 is shown in dashed lines to represent the alignment of the source and drain regions 120 with the channel region 130.

Turning now to FIGS. 2A and 2B, cross-sectional views show nanowire transistor structure 100 in accordance with another embodiment of the present disclosure, where FIG. 2A is a section taken through the channel region 130 along a fin of one device, and FIG. 2B is a section taken through the gate structure 140 and perpendicular to the channel regions 130 of three devices. In this example embodiment, the relaxed buffer material 112 is on the substrate 110 as in the embodiment discussed above with reference to FIGS. 1A-1B. A layer of isolation material 150 is on the relaxed buffer material 112 below the S/D regions 120. Stated differently, the isolation material 150 is between the S/D material 120 and the relaxed buffer material 112, where the isolation material 150 is in contact with the top surface of the relaxed buffer material 112 and with the bottom surface of the S/D material 120.

The isolation material 150 can be aluminum oxide (e.g., $Al_2O_3$), silicon nitride (e.g., $Si_3N_4$), aluminum oxynitride (e.g., $(AlN)_x$—$(Al_2O_3)_{1-x}$), carbon oxy nitride compounds (—CNO), oxynitride compounds (—NO) or other suitable electrically insulating material. The isolation material 150 is amorphous or is otherwise unsuitable for epitaxial growth of the replacement S/D material with a monocrystalline structure, in accordance with some embodiments. Since the isolation material 150 is deposited prior to growth of the replacement S/D material and after formation of the gate structure 140, the isolation material 150 is not present in the channel region 130. For example, after recessing the original S/D material 120 in the structure, the isolation material 150 can be deposited conformally, followed by epitaxial growth of the replacement S/D material 120 in a lateral direction from the ends of the nanowires 132. An example process flow is discussed in more detail below for embodiments that include the isolation material 150.

Referring now to FIGS. 3A and 3B, cross-sectional views show nanowire transistor structure 100 in accordance with another embodiment of the present disclosure, where FIG. 3A is a section taken through the channel region 130 along a fin of one device, and FIG. 3B is a section taken through the gate structure 140 and perpendicular to the channel regions 130 of three devices. In one embodiment, the epitaxial material of the S/D regions 120 is compositionally different for NMOS and PMOS devices. To benefit NMOS devices, the material of the S/D regions 120 has reduced germanium content, such as 30 at % Ge or below, including 25 at %, 20 at %, 15 at %, 10 at %, 5 at %, or less. Such material exhibits advantageous carrier mobility for NMOS devices. To benefit carrier mobility in PMOS devices, however, the material of the S/D regions 120 can have increased germanium content, such as 50% to 85% Ge. In other embodiments for PMOS devices, the material of the S/D region 120 has a Ge content similar to that of NMOS devices (e.g., 30 at % or less), but includes tin to increase strain. In one embodiment, SiGeSn includes tin in an amount to provide strain equivalent to SiGe with about 50% Ge even though the actual Ge content is less than that. For example, SiGeSn with a tin concentration from 6 to 7% provides strain similar to that of $Si_{0.4}Ge_{0.4}$ even though the actual germanium concentration is lower (e.g., ~20%). Doping the S/D regions 120 can also be utilized to control strain, such as doping with boron (B), aluminum (Al), gallium (Ga), or indium (In) for p-type materials and phosphorous (P), arsenic (As), and antimony (Sb) for n-type materials, as will be appreciated. Referring now to FIGS. 4A and 4B, cross-sectional views show nanowire transistor structure 100 in accordance with another embodiment of the present disclosure, where FIG. 4A is a section taken through the channel region 130 along a fin of one device, and FIG. 4B is a section taken through the gate structure 140 and perpendicular to the channel regions 130 of three devices. In one embodiment, the material of the S/D regions 120 exhibits reduced damage as a result of etching out the sacrificial material in the channel region 130. For example, when the channel region 130 begins as a layer stack of Si and SiGe, silicon is the sacrificial material in the layer stack when forming SiGe nanowires. As the silicon is removed by etching, for example, epitaxial SiGe material of the S/D regions 120 can be unintentionally damaged due to having sufficiently high silicon content. That is, the greater the silicon content, the more susceptible the SiGe material is to etch damage when using a etchant that attacks silicon. To prevent or reduce such etch damage, the S/D region 120 can include an end portion 124 adjacent the channel region 130 or gate spacers 146, where the end portion 124 is rich in germanium. For example, the Ge-rich end portion 124 is between the channel region 130 and a body portion 122 of the SiGe S/D region 120. The Ge-rich end portion 124 functions as an etch-resistant structure that resists damage 120 during the etch process used to release nanowires 132 in the channel region 130 due to having a relatively high content of Ge. In some embodiments, the Ge-rich end portion 124 has a germanium content up to 100%.

Stated in more general terms, the layer stack has a first material (e.g., SiGe) and second material (e.g., Si), where the first material and second material have one or more common element (e.g., Si). The second material can consist essentially of the common element(s). The first material has an additional element (e.g., Ge) that is relatively inert to the etch processes used to remove the common element(s) (e.g., Si). As such, when the first material is rich in the additional element (e.g., 80%+Ge), the first material is minimally affected by etch processes used to selectively remove the second material.

In one embodiment, the S/D region 120 has a Ge-rich end portion 124 with up to 100% Ge at the channel region 130. As such, the end portion 124 of the S/D region 120 is minimally affected or not appreciably affected by an etch process that is selective to remove Si (but not Ge). In another embodiment, the S/D region has up to 100% Ge at the interface with the channel region 130, and gradually decreases in Ge concentration along the end portion 124 moving away from the channel region 130 and towards the body portion 122 of the S/D region 120. The body portion 122 can be identified in some embodiments as having a consistent concentration of Si and Ge. For example, the end portion 124 has a graded Ge concentration from 100% to about 80% from the interface with the channel region 130 to the interface with the body portion 122 of the S/D region 120, respectively. In yet other embodiments, the end portion 124 has two or more distinct layers of SiGe with reducing concentration of Ge in each layer moving from a layer in contact with the channel region 130 to a layer in contact with the S/D body portion 122.

In another embodiment, the end portion 122 of the S/D region 120 adjacent the channel region 130 is SiGe and further includes carbon in an amount up to 4% C, including 1-2%. Such an embodiment may be used in both PMOS and NMOS devices. For example, the end portion 124 comprises SiGeC, where the end portion has up to 85% Ge and up to 4% C (such as 1-2%); the balance is Si plus any dopants or other impurities, as will be appreciated. In other embodiments, the SiGe has germanium in an amount of at least 50 atomic percent and also include carbon up to 4 atomic percent. Carbon can be used in such embodiments to reduce diffusion of phosphorous dopant, as will be appreciated.

The end portion 124 of the S/D region 120 has a lateral thickness no greater than 10 nm (e.g., measured between the S/D body portion 122 and the channel region 130). In some embodiments, the end portion 124 has a lateral thickness of 2 nm or less, 4 nm or less, 6 nm or less, 8 nm or less, 10 nm or less, 15 nm or less, or 20 nm or less. Other suitable values of thickness for the end portion 124 will be apparent in light of the present disclosure.

Turning now to FIG. 5, a flowchart illustrates a process flow for a method 500 of forming an integrated circuit that includes one or more nanowire or nanoribbon transistor, in accordance with an embodiment of the present disclosure. Processes in method 500 include blanket deposition techniques and/or any other suitable techniques as will be apparent in light of this disclosure. Although processes in this example are described in the context of forming a nanowire FinFET transistor, other nanowire or nanoribbon structures can be formed using a variation of method 500, including planar transistor configurations, vertical transistor structures, TFETs, and the like.

In one embodiment, method 500 begins with providing 505 a semiconductor substrate 110. The substrate 110 may include any suitable material, such as monocrystalline semiconductor material that includes at least one of silicon (Si), germanium (Ge), carbon (C), tin (Sn), phosphorous (P), boron (B), arsenic (As), antimony (Sb), indium (In), and gallium (Ga) to name a few examples. In some embodiments, the substrate 110 is bulk silicon, such as monocrystalline silicon wafer. In other embodiments, the substrate 110 can be any suitable semiconductor material, including silicon, silicon carbide (SiC), gallium nitride (GaN), and gallium arsenide (GaAs) to name a few examples. The substrate 110 can be selected in some embodiments from III-V materials and group IV materials. Further, the substrate 110 can comprise a semiconductor material layer deposited or grown on a substrate, such as silicon carbide layer epitaxially grown on a sapphire substrate.

The substrate 110 in some embodiments may include a Si on insulator (SOI) structure where an insulator/dielectric material (e.g., an oxide material, such as silicon dioxide) is sandwiched between two Si layers (e.g., in a buried oxide (BOX) structure), or any other suitable substrate where the top layer includes monocrystalline Si. In some embodiments, the substrate 110 may be doped with any suitable n-type and/or p-type dopant at a dopant concentration in the range of 1E16 to 1E22 atoms per cubic cm, for example. For instance, a silicon substrate can be p-type doped using a suitable acceptor (e.g., boron) or n-type doped using a suitable donor (e.g., phosphorous, arsenic) with a doping concentration of at least 1E16 atoms per cubic cm. However, in some embodiments, the substrate 110 may be undoped/intrinsic or relatively minimally doped (such as including a dopant concentration of less than 1E16 atoms per cubic cm), for example. In some embodiments, the substrate 110 is a substrate consisting essentially of Si, such as a monocrystalline silicon wafer. In other embodiments, the substrate 110 may primarily include Si but may also include other material (e.g., a dopant at a given concentration). Also, note that the substrate 110 may include relatively high quality or device-quality monocrystalline Si or other material that provides a suitable template or seeding surface from which other monocrystalline semiconductor material features and layers can be formed. Therefore, unless otherwise explicitly stated, a substrate 110 as described herein is not intended to be limited to a substrate that only includes Si.

In some embodiments, the substrate 110 may have a crystalline orientation described by a Miller index of (100), (110), or (111), or its equivalents, as will be apparent in light of this disclosure. Although the substrate 110 in this example embodiment is shown for ease of illustration as having a thickness (dimension in the Y-axis direction) similar to that of other layers in the figures, the substrate 110 may be relatively much thicker than the other layers, such as having a thickness in the range of 1 to 950 microns (or in the sub-range of 20 to 800 microns), for example, or any other suitable thickness or range of thicknesses as will be apparent in light of this disclosure. In some embodiments, the substrate 110 may include a multilayer structure including two or more distinct layers that may or may not be compositionally different. In some embodiments, the substrate 110 may include grading (e.g., increasing and/or decreasing) of one or more material concentrations throughout at least a portion of the material. In some embodiments, the substrate 110 may be used for one or more other IC devices, such as various diodes (e.g., light-emitting diodes (LEDs) or laser diodes), various transistors (e.g., MOSFETs or TFETs), various capacitors (e.g., MOSCAPs), various microelectromechanical systems (MEMS), various nanoelectromechanical systems (NEMS), various radio frequency (RF) devices, various sensors, or any other suitable semiconductor or IC devices, depending on the end use or target application. Accordingly, in some embodiments, the structures described herein may be included in a system-on-chip (SoC) application, as will be apparent in light of this disclosure.

Method 500 continues with depositing 510 buffer material 112 on the substrate 110. In some embodiments, the buffer material is a layer with a thickness no greater than 200 nm and has a relaxed lattice constant relative to the substrate 110. In another example, the substrate 110 consists essentially of monocrystalline silicon and the relaxed buffer material 112 is $Si_{1-x}Ge_x$ with x from 0.2 to 0.45. For example, the buffer material is SiGe with a germanium content of 20-25 at %, 20-30 at %, 25-30 at %, 30-35 at %, 30-40 at %, 35-40 at %, 35-45 at %, or 40-45 at %. In some embodiments, the buffer material 112 has a thickness of 300 nm or less, 250 nm or less, 200 nm or less, 150 nm or less, 100 nm or less, 50 nm or less, or 20 nm or less. After depositing 510 the relaxed buffer material 112, the buffer material 112 is optionally annealed. The buffer material 112 optionally can be polished to planarize the material and/or to reduce the material to the desired thickness, as will be appreciated.

In some embodiments, depositing 510 the buffer material 112 includes a depositing a multilayer stack on the layer of buffer material 112, where the multilayer stack has up to 100% Ge and is capable of further relaxation to facilitate strained and nominally defect-free SiGe channel layers with up to 85% Ge. For example, the buffer includes a layer of a first buffer material on the base and one or more additional layers of compositionally different material. For example, the first layer of buffer material is $Si_{1-x}Ge_x$ with x from 0.2 to 0.45, such as about 0.3. Successive SiGe layers can be deposited on the first layer of buffer material to further relax the in-plane lattice constant in a way that maintains a nominally defect-free condition. In one embodiment, the multilayer stack includes successive layer pairs of Si and SiGe. In another embodiment, the additional buffer layers can be a plurality of layers of SiGe with successively increasing germanium content up to 85%. In another example embodiment, the additional buffer materials include a plurality of layers of SiGe, where each layer of SiGe has a lattice mismatch of about two percent or less with the layer of SiGe below it. Structures formed according to methodologies of the present disclosure can provide channel materials that are virtually free of stacking faults, resulting in improved carrier mobility over channel material formed according to traditional methods.

Figure 6:
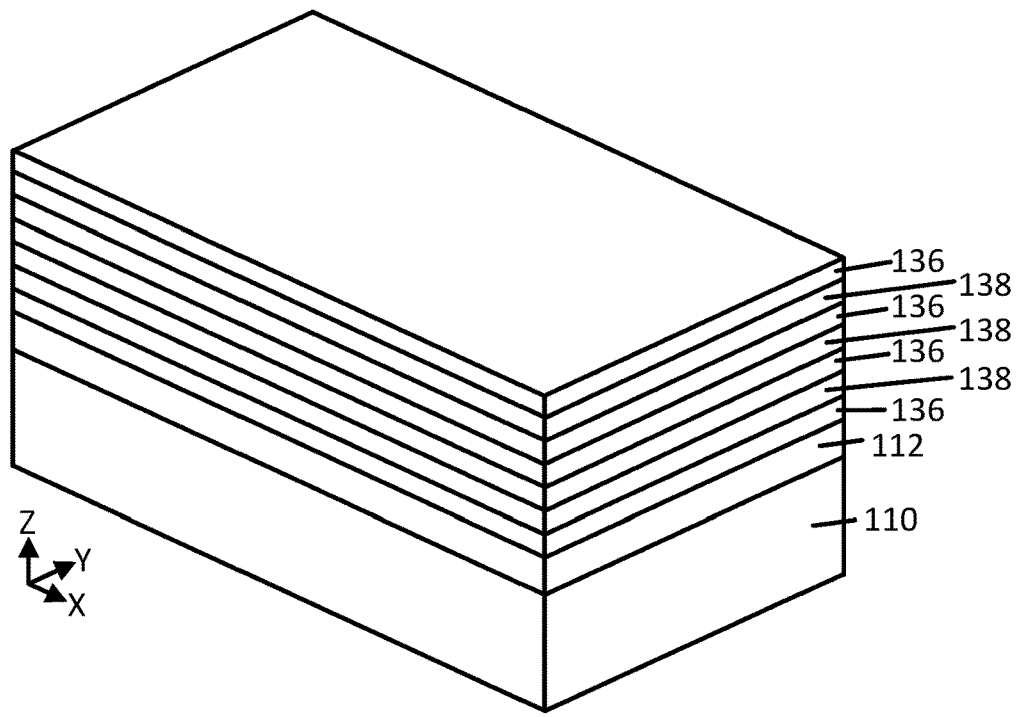
FIG. 6 illustrates a perspective view of a semiconductor structure showing a silicon substrate with a layer of relaxed buffer material and a layer stack with alternating blanket layers of sacrificial material and channel material, in accordance with an embodiment of the present disclosure.

Method 500 continues with depositing 515 a layer stack 134 on the relaxed buffer material 112, where the layer stack 134 has alternating layers of a sacrificial material 136 and channel material 138, in accordance with some embodiments. FIG. 6 illustrates a perspective view of an example structure with a silicon substrate 110, a layer of relaxed buffer material 112 (SiGe), and a layer stack 134 of sacrificial material 136 and channel material 138.

In one embodiment, alternating blanket layers of sacrificial material 136 and channel material 138 can be formed using layer-by-layer epitaxial growth, where the sacrificial material 136 can subsequently be removed to release nanowires of the channel material 138. In one embodiment, a first layer of sacrificial material 136 is formed directly on the relaxed buffer material 112, followed by forming a first layer of channel material 138 directly on the first layer of sacrificial material 136, and followed similar fashion by depositing additional layer pairs of sacrificial material 136 and channel material 138, and finally followed by depositing a top layer of sacrificial material 136. For example, when the first (bottom) layer and the last (top) layer of the layer stack 134 is the sacrificial material 136, layers of channel material 138 (e.g., SiGe) are sandwiched between layers of the sacrificial material 136. In one example embodiment, the sacrificial material 136 is monocrystalline silicon (Si), the channel material 138 is monocrystalline silicon germanium (SiGe). In other embodiments, the sacrificial material 136 is SiGe and the channel material 138 is Si. Other pairs of sacrificial material 136 and channel material 138 can be used, as will be appreciated. At this stage of processing, the channel material optionally can be doped with a suitable dopant at a desired concentration, as will be appreciated.

Layer stack 134 can be formed using any suitable techniques, such as one or more deposition or epitaxial growth processes (e.g., CVD, PVD, ALD, VPE, MBE, LPE), melt regrowth, and/or any other suitable processing, as will be appreciated in light of the present disclosure. In some embodiments, the sacrificial material 136 and the channel material 138 are deposited as blanket layers on the relaxed buffer material 112. Additional processing can be performed after depositing each layer, if so desired, such as cleaning and polishing one material prior to deposition of the next material. In some embodiments, a given material of the layer stack 134 has a vertical thickness (dimension in the Z-axis direction) in the range of 5 nm to 50 nm (or in a subrange of 5-45, 5-40, 5-35. 5-30. 5-25, 5-20, 5-15, 5-10, 10-40, 10-30, 10-20, 15-40, 15-30, 15-20, 20-40, 20-30 and 30-40 nm) and/or a maximum vertical thickness of at most 50, 40, 30, 25, 20, 15, or 10 nm, for example. Other vertical thickness requirements or thresholds can be used, as will be apparent in light of this disclosure. The vertical thickness of each layer can be selected to provide the desired geometry of the nanowire, nanoribbon, or nanosheet to be subsequently formed, as will be appreciated. The materials in the layer stack 134 need not have the same vertical thickness from layer to layer nor among layers of a given material. Thus, for example, subsequently formed nanowires can have vertical spacing and vertical nanowire dimensions that may be the same or different for each nanowire, as will be appreciated.

In some embodiments, multiple different channel materials may be formed on different areas of the substrate, such as for CMOS applications, for example. For instance, a first channel material 138 (e.g., SiGe) may be formed on a first area of the substrate to be used for one or more PMOS devices and a second channel material 138 (e.g., Si) may be formed on a second area of the substrate to be used for one or more NMOS devices. By selecting the buffer material 112 to have the desired properties (e.g., lattice constant, bandgap), multiple different channel materials 138 can be formed. For instance, in some such embodiments, the first channel material may include a n-type group III-V or group IV material and a second channel material may include a p-type group III-V or group IV material.

In some embodiments employing multiple different channel materials, the first channel material 138 may include group IV semiconductor material (e.g., Si, SiGe, Ge, etc.) and the second channel material 138 may include group III-V semiconductor material (e.g., GaAs, InGaAs, InP, etc.). In general, a given channel material may include monocrystalline group IV semiconductor material and/or group III-V semiconductor material. For instance, in a beaded-fin transistor configuration, the channel region may include both group IV semiconductor material (e.g., for the broader or narrower portions) and group III-V semiconductor material (e.g., for the other of the broader or narrower portions). Note that the multiple different channel materials may be formed using any suitable techniques, such as masking, depositing, and removing the masking as desired to form any number of compositionally different channel materials. Numerous different channel material configurations and variations will be apparent in light of this disclosure.

Method 500 continues with defining 520 fins 160 from the layer stack 134, in accordance with one embodiment. For example, each fin 160 has a subfin portion 162 comprising the relaxed buffer material 112 (e.g., $Si_{1-x}Ge_x$ where 20<x<45), and an upper fin portion of alternating layers of sacrificial material 136 (e.g., Si) and channel material 138 (e.g., $Si_{1-x}Ge_x$ where 30<x<85). In some embodiments, the Ge concentration in the channel material 138 is greater than the Ge concentration in the relaxed buffer material 112. For example, the relaxed buffer material 112 has 40 at % Ge and the channel material 138 has 50 at % Ge or more (i.e., at difference of 10 at % or more). In embodiments where blanket layers of material are formed on the relaxed buffer material 112 in process 515, for example, regions to be processed 520 into fins are masked, followed by etching the surrounding regions to define one or more fins. For instance, the anisotropic etch proceeds substantially vertically through the layer stack 134 to define isolation trenches between adjacent fins 160. In some embodiments, the etch process proceeds into the substrate 110 to define a fin that includes a subfin portion comprising the relaxed buffer material 112 and substrate material.

Figure 7:
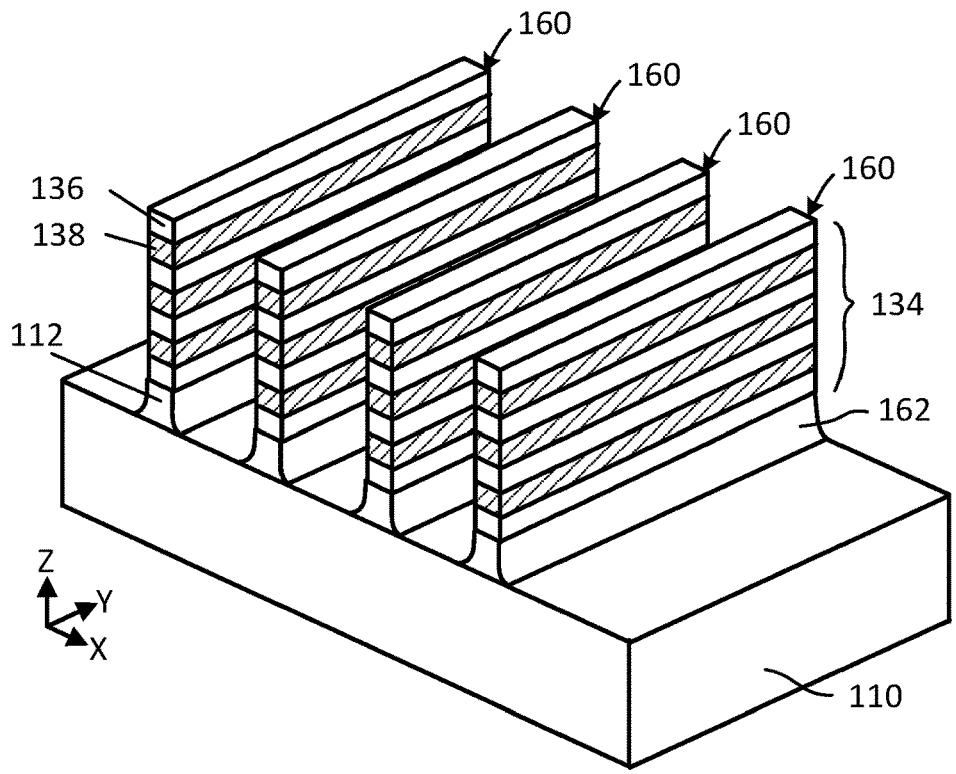
FIG. 7 illustrates a perspective view of a semiconductor structure showing the layer stack of FIG. 6 after processing to define fins, in accordance with an embodiment of the present disclosure.

In some embodiments, the etch process defines groups of parallel fins 160 extending vertically up from the substrate 110. FIG. 7 illustrates a perspective view of one example structure showing fins 160 extending up from the substrate 110. Each fin 160 includes a subfin portion 162 that includes the relaxed buffer material 112 and, in some cases, also includes some substrate material. Each fin 160 has alternating layers of sacrificial material 136 and channel material 138 from the layer stack 134. In other embodiments, the etch defines planar or 3D transistor structures having an H shape, where the channel region 130 corresponds to the horizontal beam of the H extending between the source and drain regions 120 represented by a rectangular shape connected by the channel region 130 extending therebetween.

In other embodiments, for example, fins 160 are defined by forming the alternating layers of sacrificial material 136 and channel material 138 on the substrate 110 or relaxed buffer material 112 by growth or deposition in a trench. For example, method 500 includes a replacement fin-based approach, in accordance with some embodiments. In one such embodiment, the trench is an aspect ratio trapping trench ("ART" trench) defined in a layer of insulating material, such as silicon dioxide ($SiO_2$) formed by thermal oxidation or by deposition using a suitable one of the aforementioned techniques. The insulating material is then patterned and etched to define trenches that extend to a substrate or other material layer. A relaxed buffer material 112 can be formed directly on the substrate 110 in the lower portion of the trench, followed by alternating layers of the sacrificial material 136 and channel material 138. The insulating material can then be recessed to expose all or part of the fin 160. In some embodiments, the insulating material is recessed to the top of the subfin (i.e., buffer material 112) to expose only the layer stack 134 of sacrificial material 136 and channel material 138 in the upper portion of the fin 160. In other embodiments, the insulating material is recessed completely to expose the entire subfin 162 of relaxed buffer material 112 and substrate material, or recessed to a level below the first layer of sacrificial material 136 to expose a portion of the subfin 162. Numerous variations and embodiments will be apparent in light of the present disclosure.

In yet other embodiments, defining 520 fins may be performed using a replacement fin-based approach. In one embodiment, the replacement fin-based approach includes forming fins in the substrate, such as by patterning and etching bulk semiconductor material. Shallow trench isolation (STI) material is the formed around those fins, followed by recessing the native-to-substrate fins to define fin-shaped trenches in the STI material. The relaxed buffer material 112 and alternating layers of sacrificial material 136 and channel material 138 can then be formed in the fin-shaped trenches. In one embodiment, the replacement fin approach continues with removing the STI material and forming an insulating material on the substrate 110 between the subfins 162, leaving the layer stack 134 of alternating sacrificial material 136 and channel material 138 exposed.

In some embodiments, the subfin is a Group IV semiconductor material, such as single-crystal Si, Ge, or SiGe. In other embodiments, the subfin material is a Group III-V semiconductor material, such as GaAs, InGaAs, AlGaAs, or AlAs, to name a few examples. In some embodiments, the subfin material may or may not be doped with a suitable dopant (e.g., boron, phosphorous, and/or arsenic). In embodiments where the subfin material is doped, it may be n-type doped (e.g., with phosphorous or arsenic) or p-type doped (e.g., with boron) at a dopant concentration in the range of 1E16 to 1E22 atoms per cubic cm, for example. In some embodiments, the subfins may have a multilayer structure including two or more distinct layers (that may or may not be compositionally different). In some embodiments, the subfins may include grading (e.g., increasing and/or decreasing) of one or more material concentrations throughout at least a portion of the subfin material.

In some embodiments, each fin may include a vertical fin height (dimension in the Y-axis direction) in the range of 20-500 nm (or in a subrange of 20-50, 20-100, 20-200, 20-300, 20-400, 50-100, 50-200, 50-300, 50-400, 50-500, 100-250, 100-400, 100-500, 200-400, or 200-500 nm) and/or a maximum vertical fin height of at most 500, 450, 400, 350, 300, 250, 200, 150, 100, or 50 nm, for example. In some embodiments, each fin may include a horizontal fin width (dimension in the X-axis direction) in the range of 2-50 nm (or in a subrange of 2-5, 2-10, 5-10, 5-20, 5-30, 5-50, 10-20, 10-30, 10-50, 20-30, 20-50, or 30-50 nm) and/or a maximum horizontal fin width of at most 50, 30, 20, 10, or 5 nm, for example. In some embodiments, the ratio of fin height to fin width may be greater than 1, such as greater than 1.5, 2, 2.5, 3, 3.5, 4, 4.5, 5, 6, 7, 8, 9, 10, 15, 20, or greater than any other suitable threshold ratio, as will be apparent in light of this disclosure. Other suitable materials and thickness values/ranges/thresholds will be apparent in light of this disclosure.

In some embodiments, the substrate 110 or relaxed buffer material 112 may be oppositely type doped relative to the overlying channel material 138 to provide a tunnel diode configuration to help reduce or eliminate parasitic leakage (e.g., subthreshold leakage). For instance, in some embodiments, the relaxed buffer material 112 may be intentionally p-type doped (e.g., with a doping concentration of at least 1E16, 5E16, 1E17, 5E17, 1E18, 5E18, or 1E19 atoms per cubic cm) if the overlying material is to be n-type doped, or vice versa.

Method 500 continues with defining 525 a gate structure 140 in contact with the top and sides of each fin 160. In one embodiment, process 525 includes filling trenches between the fins 160 with shallow trench isolation (STI) material 152. Such processing can include depositing the STI material 152 and then optionally planarizing/polishing the structure (e.g., via CMP). In some embodiments, deposition of the STI material 152 may include any suitable deposition techniques, such as those described herein (e.g., CVD, ALD, PVD), or any other suitable deposition process. In some embodiments, STI material 152 may include any suitable electrical insulator material, such as one or more dielectric, oxide (e.g., silicon dioxide), and/or nitride (e.g., silicon nitride) materials. In some embodiments, the STI material 152 may be selected based on the material of the substrate 110. For example, the STI material 152 may be selected from silicon dioxide or silicon nitride based on the use of a Si substrate 110. The STI material 152 is recessed to expose the layer stack 134 portion of the fins 160.

In accordance with some embodiments, the gate structure 140 is a dummy gate structure formed on the channel region 130 of the fins 160. In one embodiment, the gate structure 140 includes a dummy gate oxide 144, a dummy gate electrode 142 (e.g., polysilicon), and optionally, a hardmask 148. In this example, defining 525 the gate structure 140 is performed in accordance with a gate-last process flow. In some embodiments, the dummy gate electrode 142 is made of polysilicon or other suitable material, as will be appreciated. A gate-last fabrication process may utilize a dummy gate structure 140 to allow for replacement gate processing, while a gate-first fabrication process may form the final gate structure in the first instance; the final gate structure can be formed after the S/D regions 120 have been processed. In other embodiments, the techniques may be performed using a gate-first process flow. In either a gate-last or a gate-first process flow, the end structure will include the final gate stack, as will be apparent in light of this disclosure. The dummy gate structure can define the channel region 130 and source/drain (S/D) regions 120 of each fin 160, where the channel region 130 is below the gate structure 140 (whether dummy or final gate stack), and the source and drain regions 120 are on either side of the gate structure 140 and connect to the channel region 130.

Process 525 includes forming gate spacers 146 on opposite sides of the dummy gate stack, which includes the gate electrode 142 and gate dielectric 144. The gate spacers 146 may include any suitable material, such as any suitable electrical insulator, dielectric, oxide (e.g., silicon oxide), and/or nitride (e.g., silicon nitride) material, as will be apparent in light of this disclosure. Gate spacers are formed along opposite sides of the dummy gate electrode. In one embodiment, the gate spacers 146 are formed of silicon nitride ($Si_3N_4$). Note that in some embodiments, a hardmask 148 (not shown) may be formed over the dummy gate structure 140 to protect the dummy gate electrode 142 and gate spacers 146 during subsequent processing, for example. In some embodiments, the hardmask 148 is formed on top of the dummy gate stack between the gate spacers 146.

Figure 8:
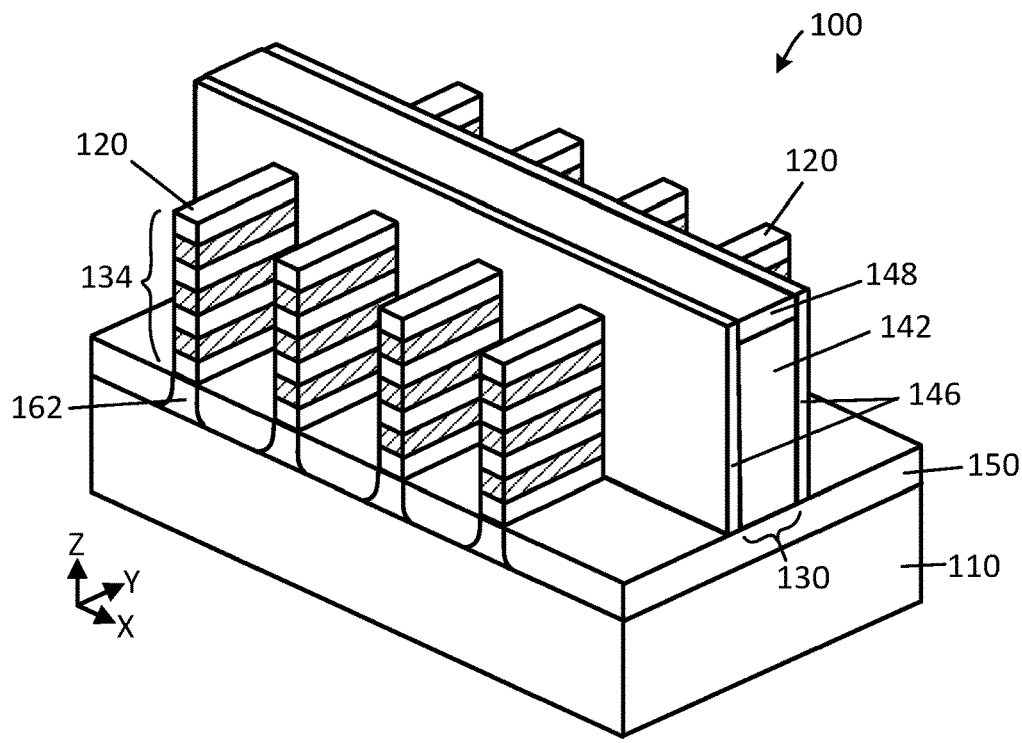
FIG. 8 illustrates a perspective view of a semiconductor structure showing the fins of FIG. 7 after formation of a gate structure, in accordance with an embodiment of the present disclosure.

FIG. 8 illustrates a perspective view of an example structure with fins 160 extending up from substrate 110 and STI material 150 between the subfin portion 162 of the fins 160. The dummy gate structure 140 is formed in contact with the top and sides of each fin 160, defining the channel region 130 below it. The gate structure 140 includes a dummy gate electrode 142, gate spacers 146 on opposite lateral sides of the gate electrode 142, and a hardmask 148 on top of the dummy gate electrode 142.

Method 500 continues with processing 545 the source/drain regions 120 using any suitable techniques, in accordance with an embodiment of the present disclosure. For example, processing 545 the source and drain regions 120 can be performed by etching 530 at least a portion of the exposed source and drain portion 120 of the fins 160. For example, the source and drain regions 120 of the fins 160 are recessed by etching. In some embodiments, all of the layer stack 134 is removed in the source and drain regions 120 of the fin, in addition to a small amount of the relaxed buffer material 112 below the layer stack 134. In other embodiments, the etch process stops short of completely removing the layer stack 134 at the source and drain regions 120, leaving behind a stub or residual portion of the fins 160. For example, the stub is a portion of the first (bottom) layer of sacrificial material 136 (e.g., Si) formed on the layer of relaxed buffer material 112 (e.g., SiGe). The source/drain etch exposes ends of the nanowire/nanoribbon channel material 138 at the outside surface of the gate spacers 146. The resulting structure may be masked as needed for deposition or growth of replacement source/drain material, as discussed in more detail below. In some embodiments, the exposed layer stack 134 in the source/drain regions of the fins need not be completely removed; instead, the material in the layer stack 134 at the source/drain regions 120 is converted to final source/drain regions by doping, implantation, and/or cladding with a source/drain material or other suitable processing, for example.

Figure 9:
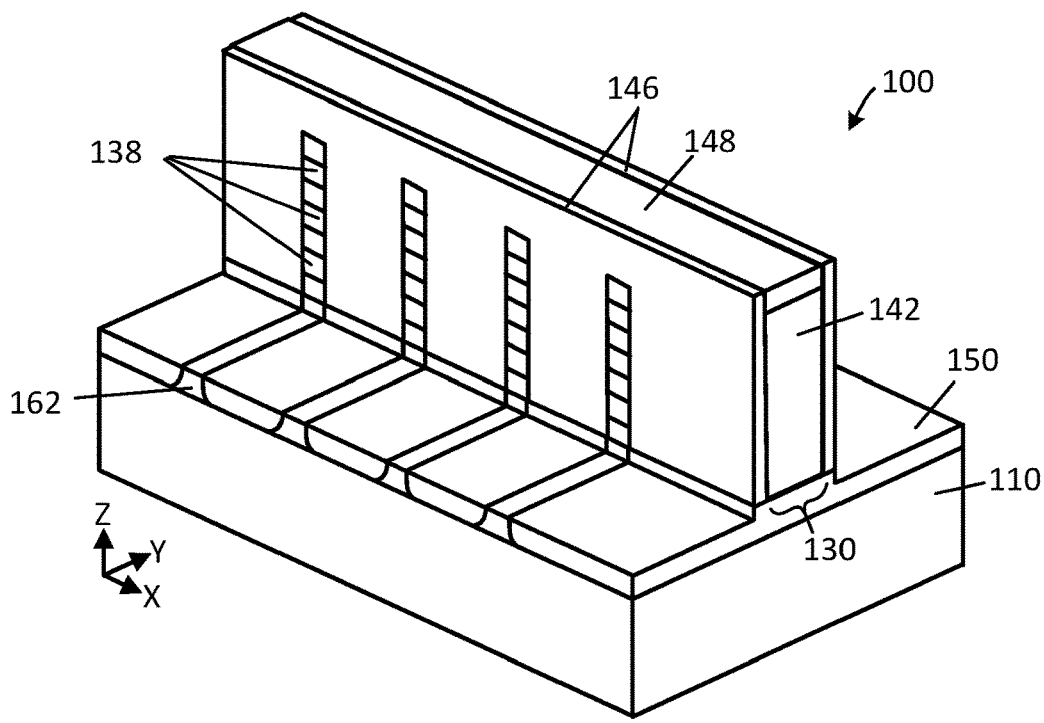
FIG. 9 illustrates a perspective view of a semiconductor structure of FIG. 8 after recessing the source and drain material, in accordance with an embodiment of the present disclosure.

FIG. 9 illustrates a perspective view of an example structure after recessing the layer stack 134 in the source and drain regions 120. The layer stack 134 in the S/D regions 120 has been recessed to the subfin portion 162 of relaxed buffer material 112. In some embodiments, the S/D regions can be further recessed, such as to the top surface of the substrate 110 or into the substrate 110. The channel material 138 in the channel region 130 is exposed at the face of the gate spacer 146.

Figure 10:
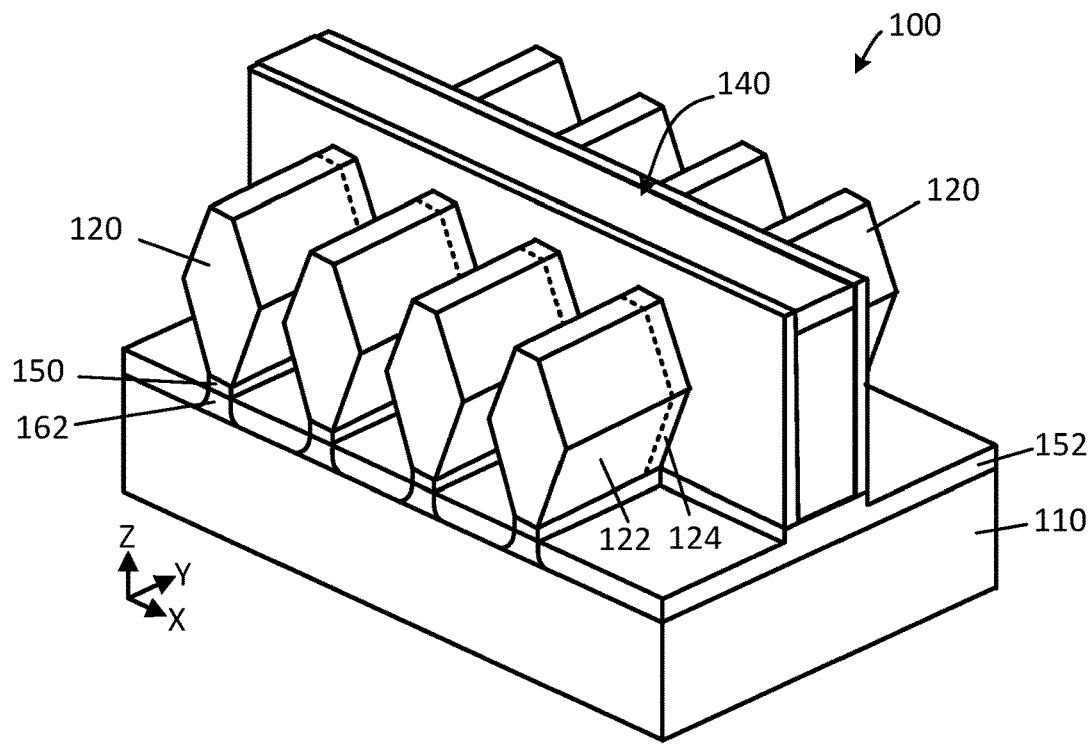
FIG. 10 illustrates a perspective view of a semiconductor structure after growing replacement source/drain material from the exposed ends of the channel material shown in FIG. 9, in accordance with an embodiment of the present disclosure.

In accordance with some embodiments, process 545 includes depositing 540 a layer of isolation material 150 over the etch S/D regions 120. For example, a blanket layer of isolation material 150 is deposited conformally on the structure of FIG. 9. The isolation material 150 can be an oxide (e.g., $SiO_2$), nitride (e.g., $Si_3N_4$), a low-k dielectric (e.g., porous $SiO_2$ or material having a dielectric constant below 3.9), alumina, oxynitride compounds, carbonoxynitride compounds, a spin-on C-rich glass, or some other electrically insulating material. The isolation material 150 is useful to inhibit source-to-drain parasitic leakage via the relaxed buffer and/or substrate 110. FIG. 10 illustrates a perspective view of an example structure showing the layer of isolation material 150. An etch-resistant material can then be deposited conformally over the isolation material 150, followed by etching. Such processing leaves a layer of isolation material 150 on the subfin 162 portions of the fins 160, where the isolation material 150 blocks epitaxial growth from the subfin 162.

Process 545 continues with epitaxially growing 535 replacement material in the source and drain region 120 using any suitable techniques, such as vapor-phase epitaxy (VPE), molecular beam epitaxy (MBE), or liquid-phase epitaxy (LPE), for example. Material of the source and drain regions 120 can be epitaxially grown laterally from the channel material 138 exposed at the gate spacer 146. For example, single-crystal material grows hemispherically outward from the exposed ends of the channel material 138.

In some embodiments, growing 535 the material of the S/D regions includes growth of a Ge-rich end portion 124 originating from the exposed channel material 138. When the channel material is SiGe, for example, the end portion 124 can have up to 100% Ge. In other embodiments, the end portion 124 gradually decreases in Ge concentration along the end portion 124 moving away from the channel material 138. For example, the end portion 124 has a graded Ge concentration from 100% where the S/D contacts the channel material 138, and gradually reduces to about 80% Ge at the body portion 122 of the S/D region 120. In yet other embodiments, the end portion 124 has two or more distinct layers of SiGe with reducing concentration of Ge in each layer moving from a layer in contact with the channel region 130 to a layer in contact with the S/D body portion 122.

In other embodiments, the end portion 122 of the S/D region 120 includes carbon (e.g., up to 4%, including 1-2%) or tin (up to 10%). For example, growing 535 the material of the S/D region 120 begins with growing the end portion 124 of SiGeC or SiGeSn, where the end portion has at least 80% Ge and includes carbon or tin; the balance is Si plus any dopants or other impurities, as will be appreciated. In other embodiments, the end portion 124 has up to 4% C or Sn and the Ge content of at least 50 at %. The material of the S/D region(s) can change in concentration of Ge from a Ge-rich end portion adjacent the channel region 130 to a Si-rich region further away from the channel region 130.

The end portion 124 of the S/D region 120 has a lateral thickness no greater than 10 nm (e.g., measured between the S/D body portion 122 and the channel region 130). In some embodiments, the end portion 124 has a lateral thickness of 2 nm or less, 4 nm or less, 6 nm or less, 8 nm or less, 10 nm or less, 15 nm or less, or 20 nm or less. Other suitable values of thickness for the end portion 124 will be apparent in light of the present disclosure.

In some embodiments, the source and drain regions 120 may be formed one polarity at a time, such as processing one of n-type and p-type regions, and then processing the other of the n-type and p-type regions. In some embodiments, the source and drain regions 120 may include any suitable doping scheme, such as including suitable n-type and/or p-type dopant (e.g., in a concentration in the range of 1E16 to 1E22 atoms per cubic cm). However, in some embodiments, at least one source or drain region 120 may be undoped/intrinsic or relatively minimally doped, such as including a dopant concentration of less than 1E16 atoms per cubic cm, for example.

In some embodiments, one or more of the S/D regions may have a multilayer structure including two or more distinct layers, for example. In some such embodiments, one or more of the layers of the S/D regions 120 may include grading (e.g., increasing and/or decreasing) the content/concentration of one or more materials in some or all of the region(s). For instance, in some embodiments, it may be desired to gradually increase the concentration of a given dopant or element (e.g., Ge) as a given S/D region 120 is formed. For example, the S/D region has a relatively lower doping concentration near the channel region 130 and a relatively higher doping concentration near the corresponding S/D contact for improved contact resistance. Optionally, a dummy electrode can be formed in the S/D regions 120. Such dummy electrode can be subsequently removed for further processing as discussed below.

FIG. 10 illustrates a perspective view of an example structure after epitaxial growth of the replacement material in the S/D regions 120. A layer of isolation material 152 is below the S/D region 120 and contacts the top of the subfin 162.

Method 500 continues with releasing 550 nanowires in the channel region. Process 550 may begin with removing the dummy gate electrode 142 between the gate spacers 146 to expose the channel region 130 of each fin 160. For example, a dummy gate electrode 142 of polycrystalline silicon can be removed using a wet etch process (e.g., nitric acid/hydrofluoric acid), an anisotropic dry etch, or other suitable etch process, as will be appreciated. At this stage of processing, the layer stack 134 of alternating layers of channel material 138 and sacrificial material 136 is exposed in the channel region 130. The channel region 130 of the layer stack 134 extends between and contacts the source and drain regions 120, where ends of the layer stack 134 are protected by the gate spacers 146. The sacrificial material 136 can be removed by etch processing, in accordance with some embodiments. For example, an etch process that is selective to remove the sacrificial material (e.g., Si) in the layer stack is used to release 550 nanowires 132 of the channel material (e.g., SiGe).

Etching the sacrificial material 136 may be performed using any suitable wet or dry etching process such that the etch process selectively removes the sacrificial material 136 and leaves intact the channel material 138. In one embodiment, the sacrificial material 136 is silicon germanium (SiGe) and the channel material 138 is electronic grade silicon (Si), such as for an re-channel device. For example, a gas-phase etch using an oxidizer and hydrofluoric acid (HF) has shown to selectively etch SiGe in SiGe/Si layer stacks. In another embodiment, a gas-phase chlorine trifluoride ($ClF_3$) etch is used to remove the sacrificial SiGe material. In other embodiments, silicon can be etched selectively over SiGe using a $H_2/CF_4$/Ar plasma, such as for a p-channel device, as will be appreciated. Depending on whether Si or SiGe is the preferred channel material 138, the etch chemistry can be selected based on the germanium concentration, nanowire dimensions, and other factors, as will be appreciated. After removing the sacrificial material 136, the resulting channel region 130 includes nanowires 132 extending between the epitaxial material of the source and drain regions 120, where ends of the nanowires 132 (e.g., SiGe) contact the source and drain regions 120 and remain at least partially protected by the gate spacers 146.

Optionally, the released nanowires 132 or nanoribbons can be cleaned and/or shaped using a series of oxide formation and etchback, as will be appreciated. For example, a thin surface oxide can be formed using thermal oxidation, deposition of an oxide plus annealing, or other suitable process. A wet or dry etch process can then be used to remove the oxide. Such a sequence of oxidation and oxide removal can remove residual amounts of the sacrificial material 136 and other impurities on the channel material 138.

Figure 11:
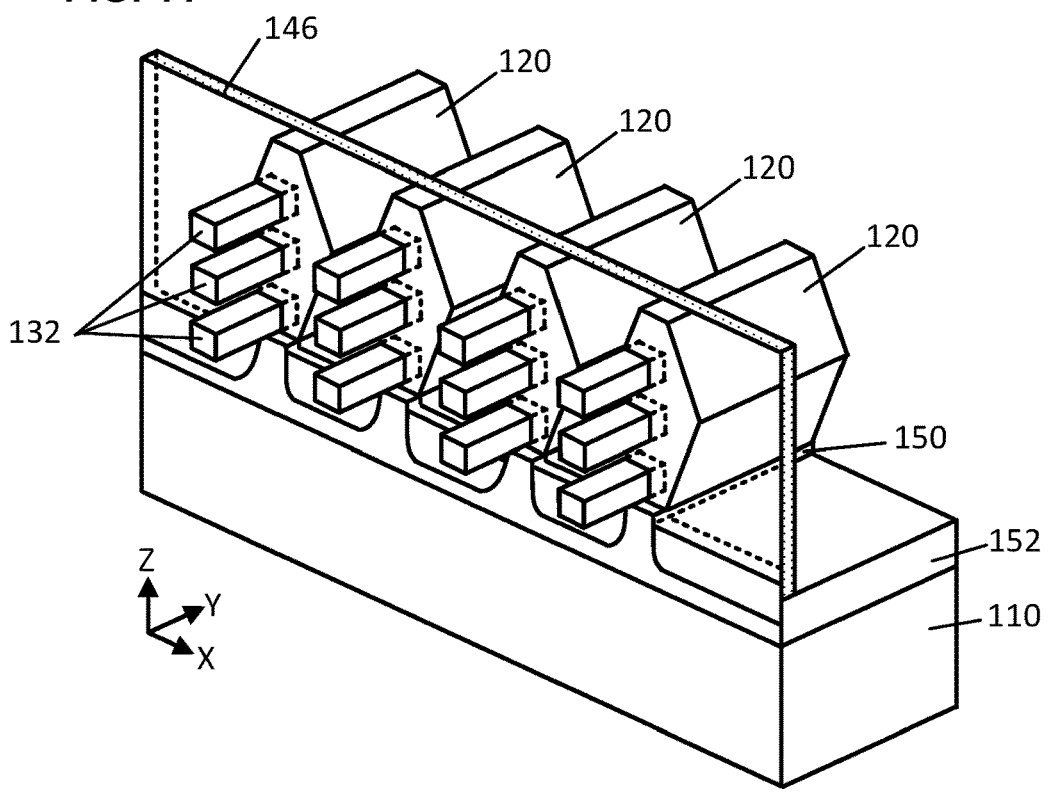
FIG. 11 illustrates a perspective view of part of the semiconductor structure of FIG. 10 after etch processing to release nanowires in the channel region, in accordance with an embodiment of the present disclosure.

FIG. 11 shows a part of the structure of FIG. 10 after releasing nanowires 132 of the channel material 138. Ends of the channel material 138 contacting the S/D region 120

In embodiments where a dummy electrode was formed in the S/D regions in process 535, the dummy electrode is removed, followed by performing a dimple etch to remove the sacrificial material 136 under the gate spacer 146. In one embodiment, the dummy electrode is an amorphous material (e.g., polysilicon) that is removed using a suitable wet or dry etch process. The opening left by the dimple etch can be filled with a low-k dielectric material. In doing so, when depositing high-k dielectric during gate processing, the high-k dielectric is present only under the gate electrode 142, rather than extending into the cavity between ends of the nanowires protected by the gate spacer 146.

Method 500 continues with final gate processing 560. Gate processing 560 includes deposition of a gate dielectric 144 on the released nanowires/nanoribbons 132, followed by deposition of a gate electrode 142 over the gate dielectric 144, in accordance with some embodiments. In this example embodiment, the gate stack is formed using a gate-last fabrication flow, which may be considered a replacement gate or replacement metal gate (RMG) process. In embodiments utilizing a nanowire channel structure, the gate stack substantially (or completely) surrounds each nanowire body portion, such as wrapping around at least 80, 85, 90, 95% or more of each nanowire body.

Gate processing 560 includes depositing a gate dielectric 144 on the exposed nanowire bodies in the channel region 130, followed by formation of a gate electrode 142 in contact with the gate dielectric 144. FIG. 12 illustrates a perspective view of a transistor structure 100 after gate processing 560, in accordance with some embodiments. Any suitable technique can be used, including spin-coating or CVD deposition, for example. The gate dielectric 144 may include, for example, any suitable oxide (such as silicon dioxide), high-k dielectric material, and/or any other suitable material as will be apparent in light of this disclosure. Examples of high-k dielectric materials include, for instance, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, lead scandium tantalum oxide, and lead zinc niobate, to provide some examples. In some embodiments, the gate dielectric 144 can be annealed to improve its quality when high-k dielectric material is used. The gate electrode 142 may include a wide range of materials, such as polysilicon or various suitable metals or metal alloys, such as aluminum (Al), tungsten (W), titanium (Ti), tantalum (Ta), copper (Cu), titanium nitride (TiN), or tantalum nitride (TaN), for example.

In some embodiments, the gate dielectric 144 and/or gate electrode 142 may include a multilayer structure of two or more material layers, for example. For instance, in some embodiments, a multilayer gate dielectric 144 may be employed to provide a more gradual electric transition from the channel region to the gate electrode, for example. In some embodiments, the gate dielectric and/or gate electrode may include grading (e.g., increasing and/or decreasing) the content or concentration of one or more materials in at least a portion of the feature(s). In some embodiments, one or more additional layers may also be present in the final gate stack, such as one or more relatively high or low work function layers and/or other suitable layers. Note that the gate dielectric 144 may also be used to form replacement gate spacers on one or both sides of the nanowire body, such that the gate dielectric 144 is between the gate electrode 142 and one or both gate spacers 146, for example. Numerous different gate stack configurations will be apparent in light of this disclosure.

Figure 13:
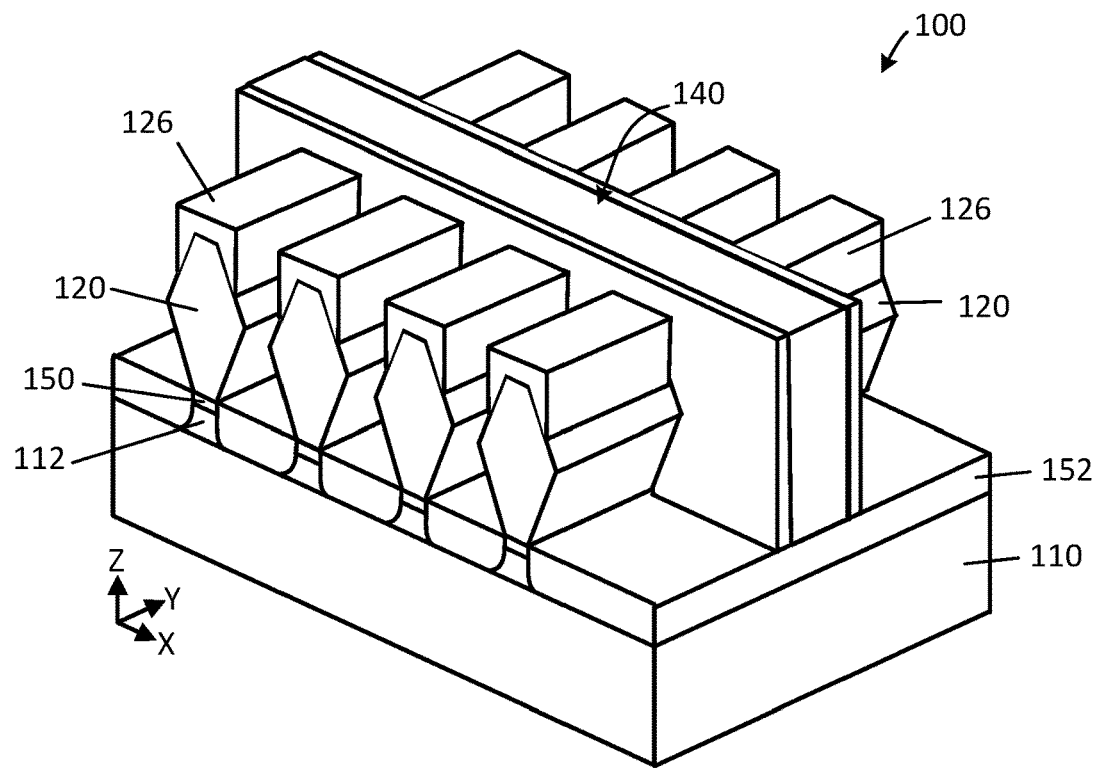
FIG. 13 illustrates a perspective view of the transistor structure of FIG. 12 after source/drain contact processing, in accordance with an embodiment of the present disclosure.
Figure 14:
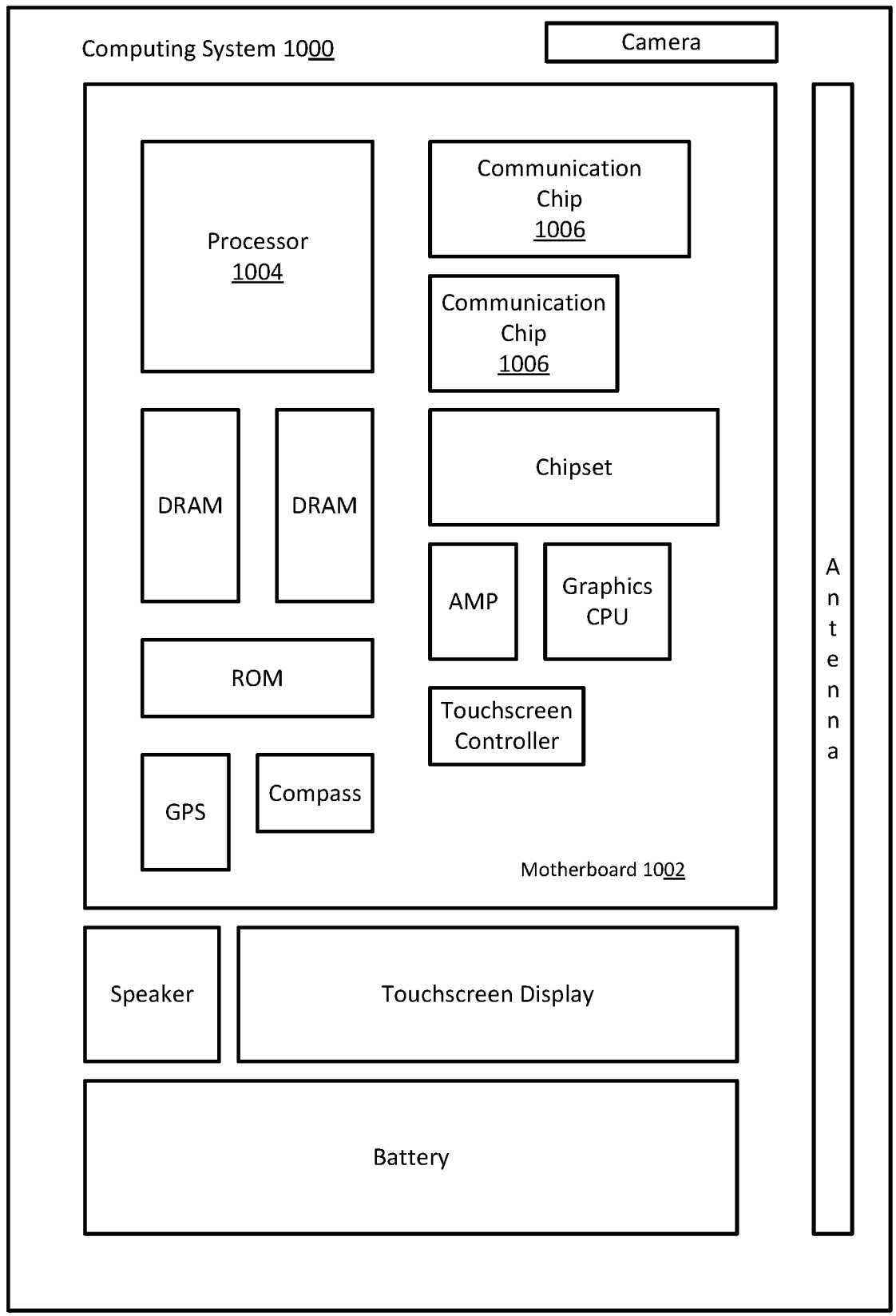
FIG. 14 illustrates an example computing system implemented with integrated circuit structures and/or transistor devices formed in accordance with some embodiments of the present disclosure.

Method 500 continues with forming 570 source/drain contacts 126. In some embodiments, process 570 includes first removing the dummy electrodes formed on the source/drain regions 120. The source and drain contacts 126 can be formed 570 using any suitable techniques, such as forming contact trenches in an ILD layer deposited over the respective source/drain regions, followed by depositing metal or metal alloy (or other suitable electrically conductive material) in the contact trenches. In some embodiments, forming 570 source/drain contacts 126 may include silicidation, germanidation, III-V-idation, and/or annealing processes, for example. In some embodiments, the source and drain contacts may include aluminum or tungsten, although any suitable conductive metal or alloy can be used, such as silver, nickel-platinum, or nickel-aluminum, for example. In some embodiments, one or more of the source and drain contacts may include a resistance reducing metal and a contact plug metal, or just a contact plug, for instance. Example contact resistance reducing metals include, for instance, nickel, aluminum, titanium, gold, gold-germanium, nickel-platinum, nickel aluminum, and/or other such resistance reducing metals or alloys. Example contact plug metals include, for instance, aluminum, copper, nickel, platinum, titanium, or tungsten, or alloys thereof, although any suitably conductive contact metal or alloy may be used. In some embodiments, additional layers may be present in the source and drain contact regions, such as adhesion layers (e.g., titanium nitride) and/or liner or barrier layers (e.g., tantalum nitride), if so desired. In some embodiments, a contact resistance reducing layer may be present between a given source or drain region and its corresponding source or drain contact 126, such as a relatively highly doped (e.g., with dopant concentrations greater than 1E18, 1E19, 1E20, 1E21, or 1E22 atoms per cubic cm) intervening semiconductor material layer, for example. In some such embodiments, the contact resistance reducing layer may include semiconductor material and/or impurity dopants based on the included material and/or dopant concentration of the corresponding source or drain region 120, for example. FIG. 14 illustrates a perspective view of a transistor structure 100 with S/D contacts 126 formed on S/D regions 120, in accordance with some embodiments. FIG. 13 illustrates a perspective view of a transistor structure 100 with S/D contacts 126 on S/D regions 120.

Method 500 continues with completing 580 a general integrated circuit (IC) as desired, in accordance with some embodiments. Such additional processing to complete an IC may include back-end or back-end-of-line (BEOL) processing to form one or more metallization layers and/or interconnect in contact with the transistor devices formed, for example. Any other suitable processing may be performed, as will be apparent in light of this disclosure. Note that the processes in method 500 are shown in a particular order for ease of description. However, one or more of the processes may be performed in a different order or may not be performed at all (and thus be optional), in accordance with some embodiments. Numerous variations on method 500 and the techniques described herein will be apparent in light of this disclosure.

Example System

FIG. 14 illustrates a computing system 1000 implemented with integrated circuit structures and/or transistor devices formed using the techniques disclosed herein, in accordance with some embodiments of the present disclosure. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing system 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device or system that processes data or employs one or more integrated circuit structures or devices formed using the disclosed techniques, as variously described herein. Note that reference to a computing system is intended to include computing devices, apparatuses, and other structures configured for computing or processing information.

Further Example Embodiments

The following examples pertain to further embodiments, from which numerous permutations and configurations will be apparent.

Example 1 is a semiconductor structure comprising a substrate comprising silicon; a buffer structure on the substrate, the buffer structure comprising a layer of buffer material comprising silicon and germanium with a germanium concentration from 20 to 45 atomic percent and having a lattice constant that is at least 75% relaxed relative to the substrate; a source and a drain on top of the layer of buffer structure; a body of monocrystalline semiconductor material extending between the source and the drain, the monocrystalline semiconductor material comprising silicon and germanium with a germanium concentration of at least 30 atomic percent; and a gate structure wrapped around the body, the gate structure including a gate electrode and a gate dielectric between the body and the gate electrode.

Example 2 includes the subject matter of Example 1, wherein the body is a nanowire or a nanoribbon.

Example 3 includes the subject matter of Examples 1 or 2, wherein the body is one of a plurality of bodies arranged in a spaced-apart vertical stack.

Example 4 includes the subject matter of any of Examples 1-3, wherein a germanium concentration of the body is at least 40 atomic percent.

Example 5 includes the subject matter of Example 4, wherein a germanium concentration is from 50 to 85 atomic percent.

Example 6 includes the subject matter of Example 4, wherein the germanium concentration is at least 60 atomic percent.

Example 7 includes the subject matter of Example 4, wherein the germanium concentration is from 70 to 85 atomic percent.

Example 8 includes the subject matter of any of Examples 1-7, wherein material of the body has a relaxed lattice constant relative to the substrate and has a strained lattice constant relative to the buffer structure.

Example 9 includes the subject matter of any of Examples 1-8, wherein the body has fewer than 1E6 defects per square centimeter.

Example 10 includes the subject matter of any of Examples 1-9, wherein the buffer structure has a thickness no greater than 300 nm.

Example 11 includes the subject matter of any of Examples 1-10, wherein the layer of buffer material has a thickness no greater than 200 nm.

Example 12 includes the subject matter of any of Examples 1-11, wherein the substrate contains defects originating at an interface between the substrate and the layer of buffer material and propagating into the substrate.

Example 13 includes the subject matter of Example 12, wherein the defects include one or more of a misfit dislocation or a stacking fault.

Example 14 includes the subject matter of any of Examples 1-13, wherein the buffer structure further comprises a layer of material with a graded concentration of germanium.

Example 15 includes the subject matter of any of Examples 1-14, wherein the layer of buffer material is a first layer of buffer material on the substrate and the buffer structure further comprises a second layer of buffer material on the first layer of buffer material, the second layer of buffer material having a higher concentration of germanium than the first layer.

Example 16 includes the subject matter of Example 15, wherein the second layer of buffer material has up to 85% germanium.

Example 17 includes the subject matter of any of Examples 1-16, wherein the layer of buffer material is monocrystalline and has fewer than 1E6 defects per square centimeter.

Example 18 includes the subject matter of any of Examples 1-17 further comprising isolation material between the layer of buffer material and a bottom of the source or drain.

Example 19 includes the subject matter of any of Examples 1-18, wherein the source and the drain each comprises silicon, germanium, and tin.

Example 20 includes the subject matter of any of Examples 1-18, wherein the source and the drain have a single crystal structure comprising silicon and germanium with at least 50 atomic percent germanium.

Example 21 includes the subject matter of any of Examples 1-18, wherein the source and the drain each includes an end portion adjacent the gate structure, the end portion comprising up to 4 atomic percent carbon.

Example 22 includes the subject matter of Example 21, wherein the end portion has from 1-2 atomic percent carbon.

Example 23 includes the subject matter of Examples 1-18, wherein the source and the drain each includes an end portion adjacent the gate structure, the end portion containing from 85 to 100 atomic percent germanium.

Example 24 is a CMOS transistor structure comprising a substrate comprising silicon; a layer of buffer material on the substrate, the buffer material comprising silicon and germanium with germanium from 20 to 45 atomic percent and having a lattice that is at least 75% relaxed with respect to the substrate; a first source and a first drain on top of the layer of buffer material; a first body comprising monocrystalline silicon and extending between the first source and the first drain; a second source and a second drain on top of the layer of buffer material; a second body extending between the second source and the second drain, the second body comprising silicon and germanium with a germanium concentration from 40 to 85 atomic percent; and a gate structure wrapped around the first body and around the second body, the gate structure including a gate electrode and a gate dielectric, wherein the gate dielectric is between the first body and the gate electrode and between the second body and the gate electrode.

Example 25 includes the subject matter of Example claim 24, wherein the substrate contains defects at an interface with the buffer layer and propagating into the substrate.

Example 26 includes the subject matter of Example 24 or 25, wherein a lattice of the substrate exhibits implant damage.

Example 27 includes the subject matter of Example claim 26, wherein the substrate further comprises one or more of carbon, arsenic, hydrogen helium, or nitrogen.

Example 28 includes the subject matter of any of Examples 24-27, wherein each of the first body and the second body is a nanowire or a nanoribbon.

Example 29 includes the subject matter of any of Examples 24-28, wherein the material of the second body has a relaxed lattice constant to the substrate and a strained lattice constant to the layer of buffer material.

Example 30 includes the subject matter of any of Examples 24-29, wherein material of the first body has a crystal lattice with tensile strain relative to the layer of buffer material and the second body has a crystal lattice with compressive strain relative to the layer of buffer material.

Example 31 includes the subject matter of any of Examples 24-30, wherein the first body is one of a plurality of first bodies and the second body is one of a plurality of second bodies, the first bodies and the second bodies selected from nanowires, nanoribbons, and nanosheets.

Example 32 includes the subject matter of any of Examples 24-31, wherein material of the second body has fewer than 1E6 defects per $cm^2$.

Example 33 includes the subject matter of any of Examples 24-32 further comprising isolation material between the layer of buffer material and the first source, between the layer of buffer material and the first drain, between the layer of buffer material and the second source, and between the layer of buffer material and the second drain.

Example 34 includes the subject matter of any of Examples 24-33, wherein each of the second source and the second drain includes an end portion adjacent the gate structure, the end portion comprising tin or carbon.

Example 35 includes the subject matter of any of Examples 24-33, wherein an end portion of the second source adjacent the gate structure comprises up to 4 atomic percent carbon, and an end portion of the second drain adjacent the gate structure comprises up to 4 atomic percent carbon.

Example 36 includes the subject matter of any of Examples 24-33, wherein an end portion of the second source adjacent the gate structure comprises at least 85 atomic percent germanium, and an end portion of the second drain adjacent the gate structure comprises at least 85 atomic percent germanium.

Example 37 includes the subject matter of any of Examples 24-33, wherein an end portion of the first source and of the first drain adjacent the gate structure and/or an end portion of the second source and of the second drain adjacent the gate structure contain germanium from 85 to 100%.

Example 38 is a method of fabricating a nanowire transistor, the method comprising providing a substrate comprising monocrystalline silicon; forming on the substrate a layer of buffer material with a thickness less than 200 nm, the layer of buffer material comprising silicon and germanium with germanium from 20 to 45 atomic percent and having a lattice structure that is at least 75% relaxed relative to the substrate; forming a layer stack over the layer buffer material, the layer stack including alternating layers of a first material comprising silicon and a second material comprising silicon and germanium, wherein the second material contains germanium in an amount from 30 to 85 atomic percent; etching the layer stack to define one or more fins; processing each of the one or more fins to include nanowires between a source and a drain; and forming a gate structure that is wrapped around the nanowires, the gate structure including a gate electrode and a gate dielectric between each of the nanowires and the gate electrode.

Example 39 includes the subject matter of Example 38 and further comprises depositing on the layer of buffer material an additional layer of buffer material, the additional layer of buffer material comprising silicon and germanium and having a germanium concentration greater than the layer of buffer material. For example, the additional layer of buffer material has a germanium concentration up to 85%.

Example 40 includes the subject matter of Examples 38 or 39 and further comprises depositing a gate structure on each of the one or more fins; recessing source and drain regions on opposite sides of the gate structure; depositing isolation material on the layer of buffer material after recessing the source and drain regions; and epitaxially growing replacement source and drain material.

Example 41 includes the subject matter of any of Example 38-40, wherein epitaxially growing the replacement source and drain material includes forming an end portion adjacent the gate structure, the end portion comprising one or more of (i) germanium from 85 to 100 atomic percent, (ii) carbon in an amount up to 4 atomic percent, or (iii) tin in an amount up to 10 atomic percent.

Example 42 includes the subject matter of Example 40, wherein epitaxially growing the replacement source and drain region material includes forming an end portion adjacent the channel region, the end portion comprising silicon, germanium, and tin.

Example 43 includes the subject matter of Example 40, wherein epitaxially growing the source and drain region material includes forming an end portion adjacent the gate structure, the end portion containing carbon in an amount up to 4 atomic percent.

Example 44 is an integrated circuit die comprising the integrated circuit of any of claims 1-23.

Example 45 includes the subject matter of Example 44, wherein the semiconductor structure comprises one of a plurality of transistors including one or more NMOS transistor and one or more PMOS transistor.

Example 46 includes the subject matter of Examples 44 or 45, wherein the semiconductor structure comprises at least one transistor of a field-effect transistor (FET), a metal-oxide-semiconductor FET (MOSFET), tunnel-FET (TFET), a planar configuration, a finned configuration, a Fin-FET configuration, a tri-gate configuration, a complementary metal-oxide-semiconductor (CMOS) circuit, a nanowire transistor, and a nanoribbon transistor, and a nanosheet transistor.

Example 47 includes the subject matter of any of Examples 44-46 further comprising a complementary metal-oxide-semiconductor (CMOS) circuit including at least one of a n-channel transistor and at least one p-channel transistor.

Example 48 is a computing system comprising one or more of the CMOS transistor structure of any of claims 24-37 or the integrated circuit of any of claims 1-23.

Example 49 includes the subject matter of Example 48, wherein the at least one transistor has a nanowire configuration, a nanoribbon configuration, or a nanosheet configuration.

Example 50 includes the subject matter of Examples 48 or 49 further comprising a processor.

Example 51 includes the subject matter of any of Examples 48-50 further comprising a memory structure.

Example 52 includes the subject matter of any of Examples 48-51 further comprising a communication chip.

Example 53 includes the subject matter of any of Examples 48-52 further comprising a touch screen controller.

Example 54 includes the subject matter of any of Examples 48-53 further comprising dynamic random-access memory.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. A semiconductor structure comprising:
   a substrate comprising silicon;
   a buffer structure on the substrate, the buffer structure comprising a layer of buffer material comprising silicon and germanium with a germanium concentration from 20 to 45 atomic percent and having a lattice constant that is at least 75% relaxed relative to the substrate;
   a source and a drain on top of the buffer structure;
   a body of monocrystalline semiconductor material extending between the source and the drain, the monocrystalline semiconductor material comprising silicon and germanium with a germanium concentration of at least 30 atomic percent; and
   a gate structure wrapped around the body, the gate structure including a gate electrode and a gate dielectric between the body and the gate electrode.

2. The semiconductor structure of claim 1, wherein the body is a nanowire or a nanoribbon.

3. The semiconductor structure of claim 2, wherein the body is one of a plurality of bodies arranged in a spaced-apart vertical stack.

4. The semiconductor structure of claim 2, wherein the body has fewer than 1E6 defects per square centimeter.

5. The semiconductor structure of claim 1, wherein the germanium concentration of the body is from 50 to 85 atomic percent.

6. The semiconductor structure of claim 1, wherein the layer of buffer structure has a thickness no greater than 300 nm.

7. The semiconductor structure of claim 1, wherein material of the body has a relaxed lattice constant relative to the substrate and has a strained lattice constant relative to the buffer structure.

8. The semiconductor structure of claim 1, wherein the substrate contains defects originating at an interface between the substrate and the layer of buffer material, wherein the defects propagate into the substrate.

9. The semiconductor structure of claim 1, wherein the layer of buffer material is a first layer of buffer material on the substrate and the buffer structure further comprises a second layer of buffer material on the first layer of buffer material, the second layer of buffer material having a higher concentration of germanium than the first layer.

10. The semiconductor structure of claim 1 further comprising isolation material between the buffer structure and a bottom of the source or drain.

11. The semiconductor structure of claim 1, wherein the source and the drain each comprises (i) silicon, germanium, and tin, (ii) silicon and germanium with at least 50 atomic percent germanium, (iii) an end portion adjacent the gate structure, the end portion comprising from 1-4 atomic percent carbon, or (iv) an end portion adjacent the gate structure, the end portion containing from 85 to 100 atomic percent germanium.

12. A CMOS transistor structure comprising:
   a substrate comprising silicon;
   a layer of buffer material on the substrate, the buffer material comprising silicon and germanium with germanium from 20 to 45 atomic percent and having a lattice that is at least 75% relaxed with respect to the substrate;
   a first source and a first drain on top of the layer of buffer material;
   a first body comprising monocrystalline silicon and extending between the first source and the first drain;
   a second source and a second drain on top of the layer of buffer material;
   a second body extending between the second source and the second drain, the second body comprising silicon and germanium with a germanium concentration from 40 to 85 atomic percent; and
   a gate structure wrapped around the first body and around the second body, the gate structure including a gate electrode and a gate dielectric, wherein the gate dielectric is between the first body and the gate electrode and between the second body and the gate electrode.

13. The CMOS transistor structure of claim 12, wherein the substrate contains defects at an interface with the buffer layer, the defects propagating into the substrate.

14. The CMOS transistor structure of claim 12, wherein a lattice of the substrate exhibits implant damage.

15. The CMOS transistor structure of claim 12, wherein material of the first body has a crystal lattice with tensile strain relative to the layer of buffer material and the second body has a crystal lattice with compressive strain relative to the layer of buffer material.

16. The CMOS transistor structure of claim 15, wherein the first body and the second body each has fewer than 1E6 defects per $cm^2$.

17. The CMOS transistor structure of claim 12, wherein the first body is one of a plurality of first bodies and the second body is one of a plurality of second bodies, the first bodies and the second bodies selected from nanowires, nanoribbons, and nanosheets.

18. The CMOS transistor of claim 12 further comprising isolation material between the layer of buffer material and the first source, between the layer of buffer material and the first drain, between the layer of buffer material and the second source, and between the layer of buffer material and the second drain.

19. A method of fabricating a nanowire transistor, the method comprising:

providing a substrate comprising monocrystalline silicon;

forming on the substrate a layer of buffer material with a thickness less than 200 nm, the layer of buffer material comprising silicon and germanium with germanium from 20 to 45 atomic percent and having a lattice structure that is at least 75% relaxed relative to the substrate;

forming a layer stack over the layer buffer material, the layer stack including alternating layers of a first material comprising silicon and a second material comprising silicon and germanium, wherein the second material contains germanium in an amount from 30 to 85 atomic percent;

etching the layer stack to define one or more fins;

processing each of the one or more fins to include nanowires between a source and a drain; and forming a gate structure that is wrapped around the nanowires, the gate structure including a gate electrode and a gate dielectric between each of the nanowires and the gate electrode.

20. The method of claim 19 further comprising:

depositing on the layer of buffer material an additional layer of buffer material, the additional layer of buffer material comprising silicon and germanium and having a germanium concentration greater than the layer of buffer material.

* * * * *